(12) United States Patent
Yoshitake et al.

(10) Patent No.: US 11,163,829 B2
(45) Date of Patent: Nov. 2, 2021

(54) SEARCH METHOD, SEARCH DEVICE, AND SEARCH SYSTEM

(71) Applicant: NATIONAL INSTITUTE FOR MATERIALS SCIENCE, Tsukuba (JP)

(72) Inventors: Michiko Yoshitake, Chiba (JP); Shinjiro Yagyu, Saitama (JP); Toyohiro Chikyo, Ibaraki (JP); Isao Kuwajima, Ibaraki (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 153 days.

(21) Appl. No.: 16/485,539

(22) PCT Filed: Feb. 7, 2018

(86) PCT No.: PCT/JP2018/004108
§ 371 (c)(1),
(2) Date: Aug. 13, 2019

(87) PCT Pub. No.: WO2018/159237
PCT Pub. Date: Sep. 7, 2018

(65) Prior Publication Data
US 2020/0387547 A1      Dec. 10, 2020

(30) Foreign Application Priority Data
Feb. 28, 2017 (JP) .............................. JP2017-037387

(51) Int. Cl.
*G06F 16/901* (2019.01)
*G06F 16/28* (2019.01)
(Continued)

(52) U.S. Cl.
CPC .... *G06F 16/9024* (2019.01); *G06F 16/24578* (2019.01); *G06F 16/288* (2019.01); *G06F 30/17* (2020.01)

(58) Field of Classification Search
CPC ............... G06F 16/9024; G06F 16/288; G06F 16/24578; G16C 20/10; G16B 50/00; G16B 5/00
See application file for complete search history.

(56) References Cited

U.S. PATENT DOCUMENTS

2005/0165594 A1* 7/2005 Chandra .................. G16B 5/00
                                                                  703/11
2010/0185400 A1* 7/2010 Doi .......................... G16B 5/00
                                                                  702/19
(Continued)

FOREIGN PATENT DOCUMENTS

JP      2003-021525 A      1/2003
JP      2007-018444 A      1/2007
(Continued)

OTHER PUBLICATIONS

Extended European Search Report and European Search Opinion dated Nov. 6, 2020, in European Patent Application No. 18761977.0.

(Continued)

*Primary Examiner* — Hau H Hoang
(74) *Attorney, Agent, or Firm* — SGPatents PLLC

(57) ABSTRACT

The present invention searches for, in order of priority, a combination of material property parameters having a significant relationship, from among arbitrary combinations of multiple material property parameters. The present invention comprises a database stored in a storage device, a graph generation step, a graph search step, and a prioritization step, wherein the database stores multiple pairs of material property parameters having mutual relationship; the graph generation step includes generating a graph in which the multiple material property parameters stored in the database are represented as nodes, and inter-node spaces corresponding to the respective material property parameter pairs each (Continued)

being stored as having a relationship therebetween are represented as edges; the graph search step includes searching the graph on the basis of a given search condition and presenting multiple related material properties or inter-material property relationship paths representing relationships between material properties; and the prioritization step includes obtaining, by using information about one or both of the nodes and the edges, priority for the presented multiple related material properties or inter-material property relationship paths, and outputting a result in the descending order of priority.

15 Claims, 20 Drawing Sheets

(51) Int. Cl.
*G06F 16/2457* (2019.01)
*G06F 30/17* (2020.01)

(56) References Cited

U.S. PATENT DOCUMENTS

| | | | |
|---|---|---|---|
| 2013/0218899 | A1 | 8/2013 | Raghavan et al. |
| 2014/0009472 | A1 | 1/2014 | Ajitomi et al. |
| 2015/0379414 | A1 | 12/2015 | Yeh et al. |
| 2017/0076041 | A1* | 3/2017 | Zhou ............... G06F 16/951 |
| 2019/0139279 | A1* | 5/2019 | Yoshitake ......... G06F 16/9024 |

FOREIGN PATENT DOCUMENTS

| | | |
|---|---|---|
| JP | 2008-226168 A | 9/2008 |
| JP | 2014-010812 A | 1/2014 |
| JP | 2016-212461 A | 12/2016 |

OTHER PUBLICATIONS

International Search Report from International Patent Application No. PCT/JP2018/004108, dated Apr. 17, 2018.

Yoshitake, et al., "Development of Search System of Material Properties Relation Diagram," Proceedings of the 64th Annual Conference of the Institute of Applied Physics Spring Conference, vol. 64, No. 14, p. 317-1, Mar. 1, 2017.

Yoshitake, et al., "Search System of Material Properties Relation Diagram for Materials Curation," Proceedings of Annual Meeting on Surface Science, vol. 37, p. 18, Aug. 17, 2017.

Berge, "Graphs and Hypergraphs," American Elsevier, Second revised edition, 1976, Chapters 1, 2 and 4, ISBN 0 444 10399 6.

Harary, "Graph Theory," Addison-Wesley Publishing Company, 1969, pp. 13-14.

Yoshitake, "Materials Curation: Material Design by Multi-Disciplinary Use of Material Information," Journal of the Japan Institute of Metals and Materials, vol. 80, No. 10, pp. 603-611, Sep. 9, 2016.

* cited by examiner

FIG. 8

| MATERIAL PROPERTY (NODE) | EDGE | | | MEASUR-ABILITY | DATA AMOUNT IN DATABASE | MATERIAL PROPERTY VALUE |
|---|---|---|---|---|---|---|
| | EXITING EDGE | ENTERING EDGE | NUMBER OF EDGES | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |

INPUT FORM  33

| CAUSE-SIDE | RESULT-SIDE | PRESENCE/ABSENCE OF RELATIONSHIP | RELATIONSHIP MEMO | RELATIONSHIP CLASSIFICATION 1 | RELATIONSHIP CLASSIFICATION 2 | CONDITION NODE | CONDITIONS | RELATIONSHIP |
|---|---|---|---|---|---|---|---|---|
| A | D | | | | | | | |
| B | D | | | | | | | |
| B | A | | | | | | | |
| D | E | | | | | | | |
| E | D | | | | | | | |
| C | E | | | | | | | |
| E | C | | | | | | | |
| M | C | | | | | | | |
| C | M | | | | | | | |
| K | J | | | | | | | |
| J | K | | | | | | | |
| J | L | | | | | | | |
| L | J | | | | | | | |
| L | K | | | | | | | |
| I | K | | | | | | | |
| K | I | | | | | | | |
| G | C | | | | | | | |
| G | F | | | | | | | |
| I | F | | | | | | | |
| G | I | | | | | | | |
| L | H | | | | | | | |

FIG. 15

34 — INPUT FORM
RELATIONSHIP MEMO
RELATIONSHIP CLASSIFICATION 1
RELATIONSHIP CLASSIFICATION 2
CONDITION NODE

| | | CAUSE-SIDE MATERIAL PROPERTY PARAMETER | RESULT-SIDE MATERIAL PROPERTY PARAMETER | PRESENCE/ ABSENCE OF RELATIONSHIP | | | | CONDITIONS | RELATIONSHIP |
|---|---|---|---|---|---|---|---|---|---|
| CHEMICAL BONDING THEORY | SURFACE PHYSICS | WORK FUNCTION | SURFACE TERM OF WORK FUNCTION | ABSENCE | 0 | | | | |
| | | SURFACE TERM OF WORK FUNCTION | WORK FUNCTION | PRESENCE | 1 | | | | |
| | | WORK FUNCTION | BULK TERM OF WORK FUNCTION | ABSENCE | 0 | | | | |
| | | BULK TERM OF WORK FUNCTION | WORK FUNCTION | PRESENCE | 1 | | | | |
| | | SURFACE TERM OF WORK FUNCTION | SURFACE DIPOLE | PRESENCE | 1 | | | | |
| | | SURFACE DIPOLE | SURFACE TERM OF WORK FUNCTION | PRESENCE | 1 | | | | |
| | | SURFACE DIPOLE | SURFACE CHARGE DISTRIBUTION | ABSENCE | 0 | | | | |
| | | SURFACE CHARGE DISTRIBUTION | SURFACE DIPOLE | PRESENCE | 1 | | | | |
| | | SURFACE COMPOSITION | SURFACE CHARGE DISTRIBUTION | PRESENCE | 0.4 | | | | |
| | | BULK TERM OF WORK FUNCTION | FERMI LEVEL DEPTH | PRESENCE | 1 | | | | |
| | | FERMI LEVEL DEPTH | BULK TERM OF WORK FUNCTION | PRESENCE | 1 | | | | |
| | | FERMI LEVEL DEPTH | BONDING POTENTIAL DEPTH | PRESENCE | 0.7 | | | | |
| | | BONDING POTENTIAL DEPTH | FERMI LEVEL DEPTH | PRESENCE | 0.7 | | | | |
| SURFACE THERMODYNAMICS | | COMPOSITION | SURFACE SEGREGATED /UNSEGREGATED | PRESENCE | 0.7 | | | | |
| | | SURFACE SEGREGATED /UNSEGREGATED | COMPOSITION | PRESENCE | 0.7 | | | | |
| | | SURFACE SEGREGATED /UNSEGREGATED | SURFACE COMPOSITION | PRESENCE | 0.4 | | | | |
| | | SURFACE SEGREGATED /UNSEGREGATED | BULK COMPOSITION | PRESENCE | 0.4 | | | | |
| MATERIAL MECHANICS | | BONDING POTENTIAL DEPTH | TENSILE STRENGTH | PRESENCE | 1 | | | | |
| | | TENSILE STRENGTH | BONDING POTENTIAL DEPTH | PRESENCE | 1 | | | CONDITION 1 | |
| | | TENSILE STRENGTH | VICKERS HARDNESS | PRESENCE | 1 | | | CONDITION 2 | |
| | | VICKERS HARDNESS | TENSILE STRENGTH | PRESENCE | 1 | | | CONDITION 2 | |
| SOLID PHYSICS | | BULK COMPOSITION | FERMI LEVEL DEPTH | PRESENCE | 0.7 | | | | |
| | | | | | | | | | |

CONDITION 1: SUBSTANCE HAVING NO SUPERPLASTICITY
CONDITION 2: PROPORTIONAL IF SUBSTANCE IS TRANSITION METAL CARBIDE

FIG. 16

| MATERIAL PROPERTY (NODE) | EDGE | | | MEASURABILITY | DATA AMOUNT IN DATABASE | MATERIAL PROPERTY VALUE |
|---|---|---|---|---|---|---|
| | EXITING EDGE | ENTERING EDGE | NUMBER OF EDGES | | | |
| WORK FUNCTION | 0 | 2 | -2 | 1 | 0.2 | |
| SURFACE TERM | 2 | 2 | 0 | 0.4 | 0.1 | |
| SURFACE DIPOLE | 1 | 1 | 0 | 0.4 | 0.1 | |
| SURFACE CHARGE DISTRIBUTION | 1 | 1 | 0 | 0.4 | 0.1 | |
| BULK TERM | 2 | 2 | 0 | 0.4 | 0.1 | |
| FERMI LEVEL DEPTH | 1 | 1 | 0 | 0.4 | 0.1 | |
| BONDING POTENTIAL DEPTH | 1 | 1 | 0 | 0.4 | 0.1 | |
| SURFACE COMPOSITION | 1 | 1 | 0 | 1 | 0.5 | |
| COMPOSITION | 0 | 0 | 0 | 1 | 0.9 | |
| SURFACE SEGREGATED /UNSEGREGATED | 2 | 2 | 0 | 1 | 0.5 | |
| TENSILE STRENGTH | 2 | 2 | 0 | 1 | 0.9 | |
| BULK COMPOSITION | 1 | 1 | 0 | 1 | 0.9 | |
| VICKERS HARDNESS | 1 | 1 | 0 | 1 | 0.9 | |

35

SEARCH METHOD, SEARCH DEVICE, AND SEARCH SYSTEM

TECHNICAL FIELD

The present invention relates to a search method, a search device, and a search system using a database, and more particularly, to a search method, a search device, and a search system capable of being preferably used for searching for a relationship among multiple material property parameters.

BACKGROUND ART

An objective of prediction and design in material research is to identify materials having target characteristics. A method that has been widely used to achieve this objective is to identify a material having target characteristics from a condition-characteristic chart. The method involves: observing a change in a characteristic upon changing only one specific condition among multiple conditions to create a chart, interpolating or extrapolating the chart to obtain a condition under which the target characteristic is achieved, thereby identifying a material that matches the condition. The term "chart" herein is synonymous with "graph" which represents a line graph etc. However, the term "chart" is hereafter used to distinguish from a "graph" formed of nodes and edges, which will be described later.

Here, a change in characteristics upon changing only one specific condition among multiple conditions is often obtained experimentally. This is because, even if many documents are searched, it is difficult to obtain a large amount of data of which all the conditions except for the above specified condition are the same.

PTL 1 discloses a search system capable of objectively searching constituent substance information of a new material having desired characteristics.

The search system disclosed in PTL 1 includes a database having multiple pieces of material property parameter information for each of multiple (many) substances. For example, when there are m material property parameters for n substances, the database is expressed as a table of n columns and m rows. Here, an individual substance may include not only material property parameters to obtain real data but also material property parameters to which real data is not provided. That is, there may be blanks in the table of n rows and m columns.

Two-dimensional space or three or more-dimensional space are created with the material property parameter to be searched as one axis and some of the other material property parameters as other axes, and each of substances in the database is mapped in the space. At this time, material property parameters without real data are interpolated by virtual data predicted by multivariate analysis, calculation based on a predetermined logical expression, the first-principles calculation, etc.

In a search map obtained by mapping real data and virtual data, a substance having desired characteristics is considered to be identified based on a rule prescribed in advance.

CITATION LIST

Patent Document

PTL 1: Japanese Patent Application Laid-Open No. 2007-18444

Non-Patent Document

[NPL 1] Berge, C "The Theory of Graphs" Translated by Masao Iri Masao et al., Saiensu-sha Co., Ltd., 1976, ISBN 4-7819-0111-5

[NPL 2] Frank Harary "Graph Theory" Translated by Ikeda Sadao, Kyoritsu Shuppan Co., Ltd., 1971, ISBN 978-4-320-01073-4

[NPL 3] Yoshitake Michiko, Journal of the Japan Institute of Metals and Materials, volume 80, No. 10, pp. 603-611, 2016

SUMMARY OF THE INVENTION

Problems to be Solved by the Invention

The inventors have studied PTL 1 and found new problems as follows.

In the technique described in PTL 1, relationships among multiple material property parameters are used to predict virtual data. The relationships among material property parameters are relationships based on scientific evidence existing between different material property parameters, that is, theoretically explained and formulated relationships. For example, a calculation based on the above predetermined logical formula and the first-principles calculation are also included in these relationships. In addition to these relationships, an experimentally obtained relationship also exists. There are many material property parameters known to have mutual relationships when obvious correlation thereamong is found from experimental data even at a stage at which neither theoretical explanation nor formulation has been made. In particular, by searching across multiple technical fields, combinations of material property parameters known to have relationships thereamong can be increased.

When search is conducted across multiple technical fields as described above, the number of material property parameters becomes very large. Therefore, the number of arbitrary combinations regardless of presence/absence of the relationship is to be calculated mathematically, i.e., a huge number. When the number of material property parameters to be treated is K, an arbitrary combination of two material property parameters among them is $K!\times(K-1)!/2$. Therefore, relationships that can be used in the related art search systems as that described in PTL 1 are limited to already known combinations among combinations of material property parameters. In order to extend the above limits to combinations regarding which relationships are unknown, since the number of arbitrary combinations is significantly large as described above, a user's own knowledge and experience becomes important. However, when search is conducted across multiple technical fields, it is unrealistic to expect users to possess extensive knowledge and experience covering the entire technical fields.

As a result of extensive studies on a method for extracting such an unknown relationship among material property parameters, the inventors have found that it is highly possible that relationships of multiple material property parameters which have not been considered due to weak relevance across technical fields themselves actually exist.

An object of the present invention is to provide a search method, a search device, and a search system that search, in order of priority, an unknown combination of material property parameters having a significant relationship and their correlations based on already known relationships among multiple arbitrary combinations of material property parameters.

Other problems and novel features will be apparent from the description of the specification and the accompanying drawings.

Means for Solving the Problem

Configurations as means to solve the present invention will be described as follows.

Configuration 1

A search method for searching for a relationship between material properties, the search method including a database held in a storage device, a graph generation step, a graph search step, and a prioritization step, wherein the database stores multiple pairs of material property parameters having mutual relationships; the graph generation step includes generating a graph in which the multiple material property parameters stored in the database are represented as nodes, and inter-node spaces corresponding to the respective material property parameter pairs each being stored as having a relationship therebetween are represented as edges; the graph search step includes searching the graph on the basis of a given search condition and presenting multiple related material properties or inter-material property relationship paths representing relationships between material properties; and the prioritization step includes obtaining, by using information about one or both of the nodes and the edges, priority for the presented multiple related material properties or inter-material property relationship paths, and outputting a result in the descending order of priority.

Configuration 2

The search method according to Configuration 1, in which the graph is a directed graph; in the graph generation step, when a relationship between the pair of material property parameters is bidirectional, a bidirectional edge corresponding to the pair of material property parameters is generated, and when, if a value of a first material property parameter of the pair of material property parameters is determined, a value of a second material property parameter is determined but not vice versa, a one-way edge from a node corresponding to the first material property parameter to a node corresponding to the second material property parameter is generated as the corresponding edge.

Configuration 3

The search method according to Configuration 1 or 2, in which the search method further including a condition extraction step and a path evaluation step, in which: regarding a pair of material property parameters for which a condition for prescribing presence/absence of a relationship exists among the multiple pairs of material property parameters having mutual relationships, the database is further capable of storing that condition; in the condition extraction step, the condition is extracted from the database in association with, as a conditional edge, an edge corresponding to a pair for which presence/absence of a relationship is prescribed by that condition; in the graph search step, one or multiple paths are extracted from the graph and outputs as a search result; in the path evaluation step, whether the one or multiple paths include the conditional edge is determined, and paths which include the conditional edge are excluded from the one or multiple paths when a condition corresponding to the conditional edge is not satisfied, to obtain a search result for the prioritization step; and a result including the search result for the prioritization step is output in the descending order of priority in the prioritization step.

Configuration 4

The search method according to any one of Configurations 1 to 3, in which the database is further capable of storing reliability information of a relationship indicating that, for the multiple pairs of material property parameters having mutual relationships, whether the relationship is a strictly theoretically established relationship, a relationship that has been empirically correlated and is not theoretically established, a semi-quantitative relationship, or a qualitative relationship; in the graph search step, the graph is searched by also using the reliability information to obtain a search result for the prioritization step; and a result including the search result for the prioritization step is output in the descending order of priority in the prioritization step.

Configuration 5

The search method according to any one of Configurations 1 to 4, in which in the prioritization step, priority is obtained by using at least one of a reliability level based on the reliability information, the number of edges entering and exiting the material property, measurability of the material property value, a data amount in a database of the material property value, the material property value, and the number of nodes constituting a path.

Configuration 6

The search method according to any one of Configurations 1 to 5, in which the prioritization step includes: a scoring step for scoring at least one of the reliability level, the number of edges entering and exiting the material property, the measurability of the material property value, the data amount in the database of the material property value, and the material property value; a score addition step for weighing at least one of the scores of the reliability level, the number of edges entering and exiting the material property, measurability of the material property value, the data amount in the database of the material property value, and the material property value, the scores being obtained in the scoring step, and adding the scores for each of the inter-material property relationship paths; and an inter-material property relationship paths prioritization step for arranging the inter-material property relationship paths in the order of the added score obtained by the score addition step.

Configuration 7

The search method according to Configuration 5 or 6, in which the added score is obtained for any item of the number of edges entering and exiting the material property, measurability of the material property value, the data amount in the database of the material property value, and the material property value, and a result is output in the descending order of the added score as priority.

Configuration 8

The search method according to Configuration 5 or 6, in which an item-added score in which a score for each item is weighed and added is obtained for at least one of the multiple items of the reliability level, the number of edges entering and exiting the material property, the measurability of the material property value, the data amount in the database of the material property value, and the material property value, and a result is output in the descending order of the item-added score as priority, the priorities are, by the weight for the items, a reliability level-focused priority in which the weight of the reliability level is larger than weights of other of the items, a control-focused priority in which the weight of the number of edges entering and exiting the material property is larger than weights of other of the items, a measured value-focused priority in which the weight of the measurability of the material property value is larger than weights of other of the items, a data amount-focused priority in which the weight of the data amount in the database of the material property value, from among measurable material property values, is larger than weights of other of the items, a material property-limited priority in which the weight of the material property value, from among measurable material property values, is larger than weights of other of the items, and a universal priority in which all the weights of the items are the same.

Configuration 9

A search device including: a data access means to an external database in which physical parameters are stored, a graph generation means, a graph search means, a prioritization means, and a user interface means; in which the graph generation means acquires multiple material property parameters from the external database through the data access means and generates a graph in which the acquired material property parameters are represented as nodes, and inter-node spaces corresponding to the respective material property parameter pairs each being stored as having a relationship therebetween are represented as edges; the graph search means searches the graph on the basis of a search condition given by a user by using the user interface means, and obtains a graph search result; and the prioritization means obtains priority using information about one or both of the nodes and the edges, for the presented multiple related material properties or inter-material property related paths, and outputs a prioritized search result by the user interface means.

Configuration 10

The search device according to Configuration 9, in which the search method according to any one of Configurations 2 to 8 is used.

Configuration 11

The search device according to Configuration 9 or 10, further including a data storage means, in which the data storage means stores multiple material property parameters acquired from the external database through the data access means, and generates, by using material property parameters stored in the data storage means, a graph in which nodes and inter-node spaces corresponding to the respective material property parameter pairs each being stored as having a relationship therebetween are represented as edges.

Configuration 12

A search device including: a database in which physical parameters are stored, a graph generation means, a graph search means, a prioritization means, and a user interface means; the graph generation means generates, based on the material property parameters stored in the database, a graph in which nodes and inter-node spaces corresponding to the respective material property parameter pairs each being stored as having a relationship therebetween are represented as edges; the graph search means searches the graph on the basis of a search condition given by a user by using the user interface means, and obtains a graph search result; and the prioritization means obtains priority using information about one or both of the nodes and the edges, for the presented multiple related material properties or inter-material property related paths, and outputs a prioritized search result by the user interface means.

Configuration 13

A search device according to Configuration 12, in which the search method according to any one of Configurations 2 to 8 is used.

Configuration 14

A search system including: a database, a graph generation means, a graph search means, and a prioritization means, in which the database stores multiple pairs of material property parameters having mutual relationships, and the graph generation means generates a graph in which the multiple material property parameters stored in the database are represented as nodes, and inter-node spaces corresponding to the respective material property parameter pairs each being stored as having a relationship therebetween are represented as edges, and the graph search means searches the graph on the basis of a given search condition to obtain a graph search result, and the prioritization means obtains, by using information about one or both of the nodes and the edges, priority for the presented multiple related material properties or inter-material property relationship paths, and outputting a result in the descending order of priority.

Configuration 15

The search system according to Configuration 14, in which the graph is a directed graph, and when a relationship between a pair of material property parameters is bidirectional, in the graph generation means, a bidirectional edge corresponding to the pair of material property parameters is generated, and when, if a value of a first material property parameter of the pair of material property parameters is determined, a value of a second material property parameter is determined but not vice versa, a one-way edge from a node corresponding to the first material property parameter to a node corresponding to the second material property parameter is generated as the corresponding edge.

Configuration 16

The search system according to claim 14 or 15, further including a condition extraction means and a path evaluation means, in which: regarding a pair of material property parameters for which a condition for prescribing presence/absence of a relationship exists among the multiple pairs of material property parameters having mutual relationships, the database is further capable of storing that condition; the condition extraction means extracts the condition from the database in association with, as a conditional edge, an edge corresponding to a pair for which presence/absence of a relationship is prescribed by that condition; the graph search means extracts one or multiple paths from the graph and outputs as a search result; the path evaluation means determines whether the one or multiple paths include the conditional edge and excludes paths which include the conditional edge from the one or multiple paths when a condition corresponding to the conditional edge is not satisfied, to obtain a search result for the prioritization means, and the prioritization means outputs a result including the search result for the prioritization means in the descending order of priority.

Configuration 17

The search system according to any one of Configurations 14 to 16, in which the database is further capable of storing reliability information of a relationship indicating that, for the multiple pairs of material property parameters having mutual relationships, whether the relationship is a strictly theoretically established relationship, a relationship that has been empirically correlated and is not theoretically established, a semi-quantitative relationship, or a qualitative relationship; the graph search means searches the graph by also using the reliability information to obtain a search result for the prioritization means; and a result including the search result for the prioritization means is output in the descending order of priority in the prioritization means.

Configuration 18

The search system according to any one of Configurations 14 to 17, in which the prioritization means obtains priority by using at least one of the reliability level, the number of edges entering and exiting the material property, measurability of the material property value, the amount of data in the database of the material property value, the material property value, and the number of nodes constituting the paths.

Configuration 19

The search system according to any one of Configurations 14 to 18, in which the prioritization means includes a scoring means that scores at least one of the reliability level, the number of edges entering and exiting the material property, the measurability of the material property value, the data amount in the database of the material property value, and the material property value; a score addition means that weighs at least one of the scores of the reliability level, the number of edges entering and exiting the material property, measurability of the material property value, the data amount in the database of the material property value, and the material property value, the scores being obtained in the scoring step, and adds the scores for each of the inter-material property relationship paths; and an inter-material property relationship paths prioritization means that arranges the inter-material property relationship paths in the order of the added score obtained by the score addition means.

Configuration 20

The search system according to Configuration 18 or 19, in which the added score is obtained for any item of the number of edges entering and exiting the material property, measurability of the material property value, the data amount in the database of the material property value, and the material property value, and a result is output in the descending order of the added score as priority.

Configuration 21

The search system according to Configuration 18 or 19, in which an item-added score in which a score for each item is weighed and added is obtained for at least one of the multiple items of the reliability level, the number of edges entering and exiting the material property, the measurability of the material property value, the data amount in the database of the material property value, and the material property value, and a result is output in the descending order of the item-added score as priority, the priorities are, by the weight for the items, a reliability level-focused priority in which the weight of the reliability level is larger than weights of other of the items, a control-focused priority in which the weight of the number of edges entering and exiting the material property is larger than weights of other of the items, a measured value-focused priority in which the weight of the measurability of the material property value is larger than weights of other of the items, a data amount-focused priority in which the weight of the data amount in the database of the material property value, from among measurable material property values, is larger than weights of other of the items, a material property-limited priority in which the weight of the material property value, from among measurable material property values, is larger than weights of other of the items, and a universal priority in which all the weights of the items are the same.

Effect of the Invention

According to the present invention, it is possible to provide the search method, the search device, and the search system capable of searching, in order of priority, a combination of material property parameters having a significant relationship from among multiple arbitrary combinations of material property parameters can be provided.

BRIEF DESCRIPTION OF THE DRAWINGS

FIG. 8 is an explanatory diagram illustrating an example of an input form for configuring a database of a search system.

FIG. 10 is an explanatory diagram illustrating an example of a path search result of an undirected graph.

FIG. 12 is an explanatory diagram illustrating an example of an input form for configuring a database of a search system.

FIG. 15 is an explanatory diagram illustrating an example of an input form of a specific database.

FIG. 16 is an explanatory diagram illustrating an example of an input form of a specific database.

DETAILED DESCRIPTION OF THE INVENTION

1. Outline of Embodiments

Overview of Search Method and Search System

In the present invention, a correlation between material properties is indicated by a path, which is analyzed by using the concept of nodes and edges. This concept is used in, for example, the field of the search in SNS, etc. and is based on a graph theory. Graph theories are disclosed, for example, in NPL 1 and NPL 2. The graph theory used in the present invention differs from general graph theories in that: while nodes are "objects" in general graph theories, nodes are "concepts" in the present invention; and while application events are "transitory" in general graph theories, application events are "permanent (non-transitory)" in the present invention. In the present invention, since application events are non-transitory, even when new data is added, a relationship caused by the new data is added to the relationship between existing material properties. Therefore, although the present invention uses a graph theory, the concept in using the same is different from the existing graph theories. For example, a case in which pairs of material property parameters having a relationship based on another knowledge are newly added to a database will be considered. As the pairs of material property parameters are added, the graph to be generated is expanded. As a result, it is possible to integrate multiple graphs which are regarded not to be mutually related and have been separate graphs into a single graph. This creates new path(s), whereby a possibility that a user can find existence of a new relationship(s) between material property parameters.

Figure 1:
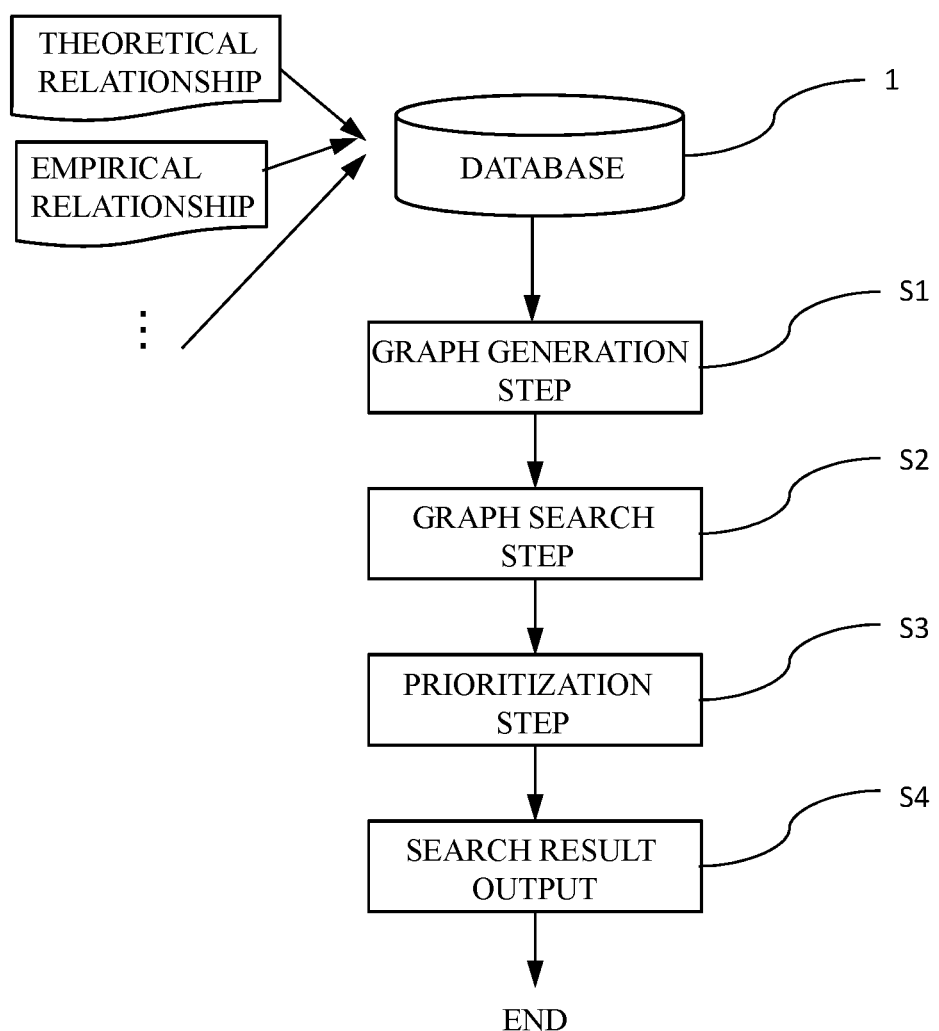
FIG. 1 is a flowchart illustrating a search step of the present invention.
Figure 2:
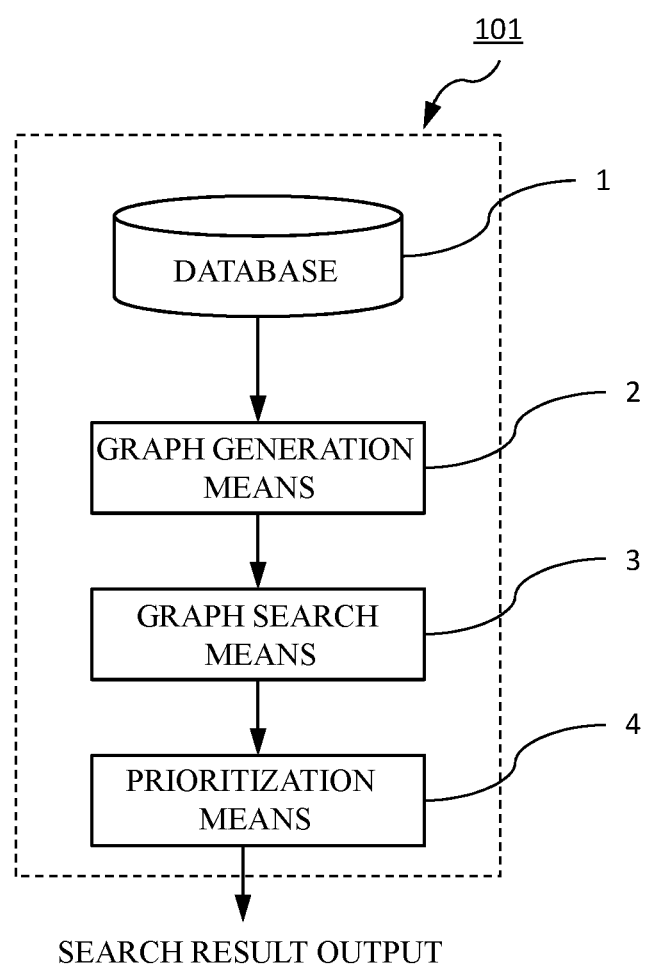
FIG. 2 is a block diagram illustrating a configuration of a search system of the present invention.

The search method of the present invention searches, as illustrated in FIG. 1, by conducting a graph generation step S1, a graph search step S2, a prioritization step S3, and a search result output S4 by using information about the material properties stored in the database 1. As illustrated in FIG. 2, a search system 101 of the present invention includes a database 1, a graph generation means 2, a graph search means 3, and a prioritization means 4. Here, the search system 101 of the present invention is constructed to function as software on a hardware system including a storage device and a computer.

The database 1 stores multiple pairs of material property parameters having mutual relationships, and the graph generation step S1 and the graph generation means 2 generate a graph in which the multiple material property parameters stored in the database are represented as nodes, and inter-node spaces corresponding to the respective material property parameter pairs each being stored as having a relationship therebetween are represented as edges and the graph search step S2 and the graph search means 3 search the graph based on a given search condition. The prioritization step S3 and the prioritization means 4 prioritize based on the graph search result obtained by the graph search step S2 and the graph search means 3. Then, the result that is prioritized and searched is output (S4). Therefore, the search method and the search system 101 capable of searching, in order of priority, a combination of material property parameters having a significant relationship based on already known relationships from among multiple arbitrary combinations of material property parameters can be provided. This search indicates the priority of a combination of material property parameters having a significant relationship. This information is significantly useful information because there is a possibility that unknown relationships are presented in order of priority.

Analysis of Relationship between Material Properties

The present invention provides relationships between material properties in order of priority. Here, analysis of relationships between material properties in the present invention will be described first, and then prioritization will be described.

Search for Graph in which Material Property Parameters are Represented as Nodes and Relationships are Represented as Edges The database 1 stores multiple pairs of material property parameters, each of multiple pairs having mutual relationship. Here, pairs of material property parameters having mutual relationships may not only be pairs of material property parameters based on scientific evidence-based relationships, that is, theoretically explained relationships, but also pairs of material property parameters known to have mutual relationships when obvious correlation is found therebetween from experimental data even at a stage at which neither theoretical explanation nor formulation has been made. Note that the "theoretically explained relationship" may include not only formulated relationships like theorems and formulae but also semi-quantitative or qualitative relationships widely explaining that presence/absence of correlation or positive/negative of correlation coefficients (i.e., while a value of one material property parameter of a pair of material property parameters increases, a value of the other also increases or decreases, etc.). Here, relationships known in any field do not necessarily have to be particularly excluded, and pairs of material property parameters of which relationships are known in every field may be included. By making the relationships that have been known only in different technical fields be integrated and shown in a graph, it is possible to conduct a path search covering the entire graph regardless of whether all the relationships are known in any technical fields. Therefore, there is a possibility that an unknown relationship among material property parameters is found newly.

Directed Graph

Figure 4:
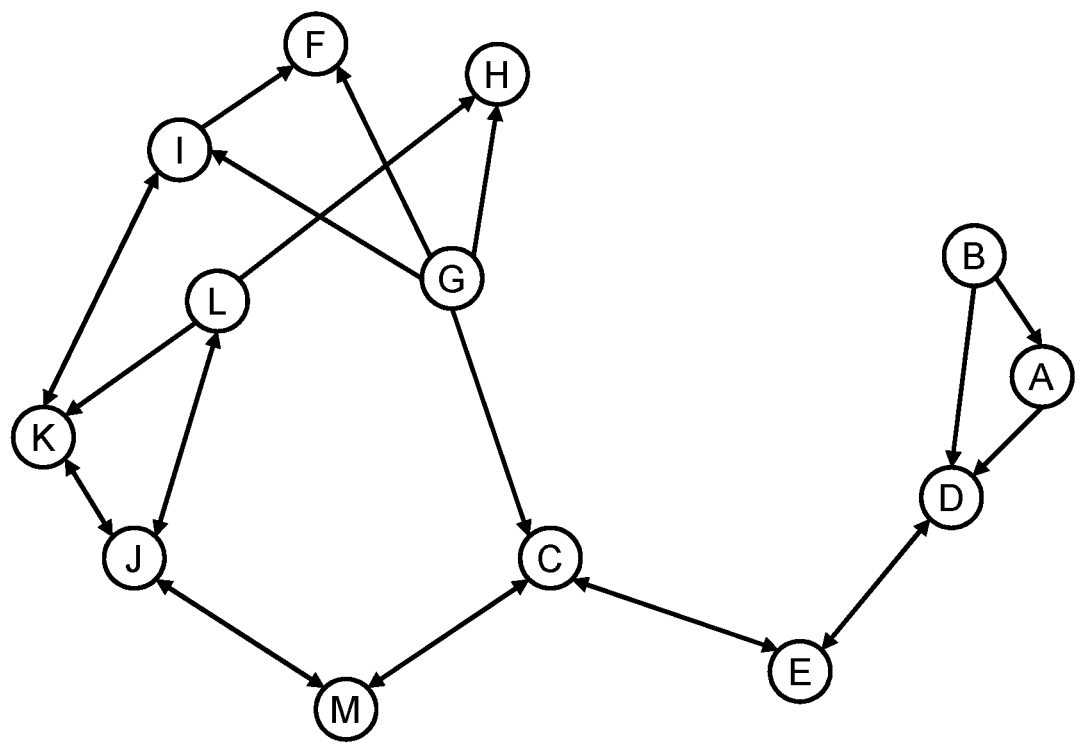
FIG. 4 is an explanatory diagram illustrating an example of a path search result of a directed graph.

As illustrated in FIG. 4, when a relationship between a pair of material property parameters is bidirectional, the graph generation means S1 generates a bidirectional edge corresponding to the pair of material property parameters, and when, if a value of a first material property parameter of a pair of material property parameters is determined, a value of a second material property parameter is determined but not vice versa, generates a one-way edge from a node corresponding to the first material property parameter to a node corresponding to the second material property parameter as the corresponding edge. In this manner, it is possible to properly treat a one-way relationship such as having a causal relationship, which may improve accuracy in path searching.

Conditional Edge

Figure 3:
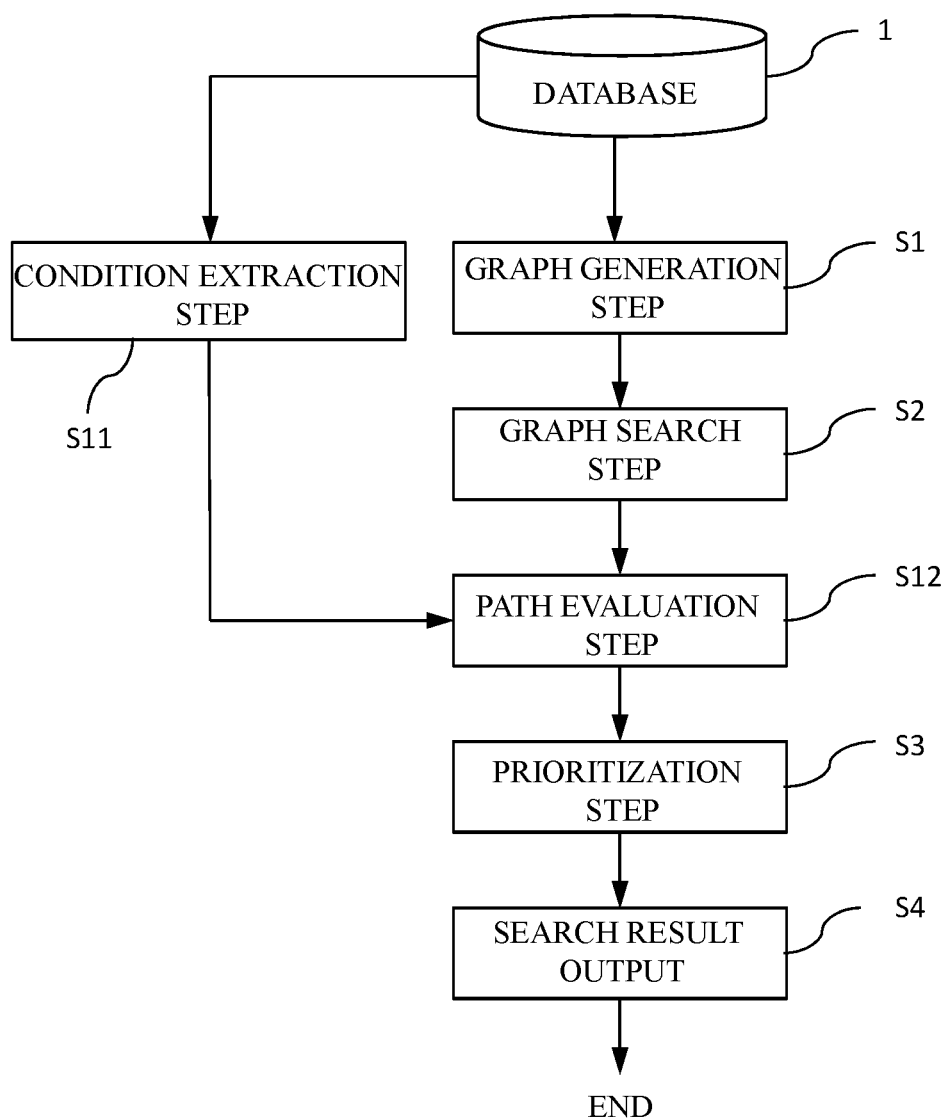
FIG. 3 is a flowchart illustrating a search step of the present invention.

As illustrated in FIG. 3, in order to perform a more advanced search prescribing the conditions between material properties, the search step may further include a condition extraction step S11 and a path evaluation step S12. The condition extraction step S11 and the path evaluation step S12 may also be considered as a graph search step in a broad sense. Here, regarding a pair of material property parameters for which a condition for prescribing presence/absence of a relationship exists among the multiple pairs of material property parameters having mutual relationships, the database 1 is further capable of storing that condition. The condition extraction step S11 extracts the condition from the database 1 in association with, as a conditional edge, an edge corresponding to a pair for which presence/absence of a relationship is prescribed by that condition.

The graph search step S3 extracts one or multiple paths from the graph as a search result and outputs the extracted paths. Here, presence/absence of the condition is not considered.

The path evaluation step S12 determines whether the conditional edge is included in the extracted one or multiple paths. When the condition corresponding to the conditional edge is not satisfied in a path that includes the conditional edge, the path evaluation step S12 excludes the path and outputs the result as a search result. Therefore, even a complicated relationship such that presence/absence of a relationship changes depending on a value of material property parameter corresponding to the relationship or a value of another material property parameter can be included in a search range. As described above, a condition for determining presence/absence of a relationship is extracted in advance from the database 1, and whether a conditional edge is included in each of multiple paths output as a search result is determined. When a conditional edge is included, it is possible, by determining whether the condition has been satisfied, to exclude paths passing through edges not satisfying the condition from the search result and output the paths as a search result. Therefore, even when a conditional edge is included, a path search with higher accuracy can be conducted.

Edge with Reliability Level Information

The database 1 is further capable of storing reliability information of a relationship indicating that, for the multiple pairs of material property parameters having mutual relationships, a relationship is a theoretically established relationship, a semi-quantitative relationship, a qualitative relationship, or a relationship is an empirically correlated but not yet theoretically established relationship. When the condition about the reliability information is included in the search condition, the graph search step S3 searches the graph based on a search condition including that condition and outputs the result. Therefore, a user can designate a search condition, such as to search a highly-reliable relationship with priority, whereby the user can conduct a path search with higher accuracy.

The path evaluation step S12 determines whether an edge with which the reliability information is associated is included in the one or multiple paths. Regarding a path that includes the edge with which the reliability information is associated, the path evaluation step S12 excludes, when the condition about reliability information is not satisfied, the path and outputs the result as a search result. Therefore, a user can designate a search condition, such as to search a highly-reliable relationship with priority, whereby the user can conduct a path search with higher accuracy.

Prioritization

Target to be Prioritized

Figure 5:
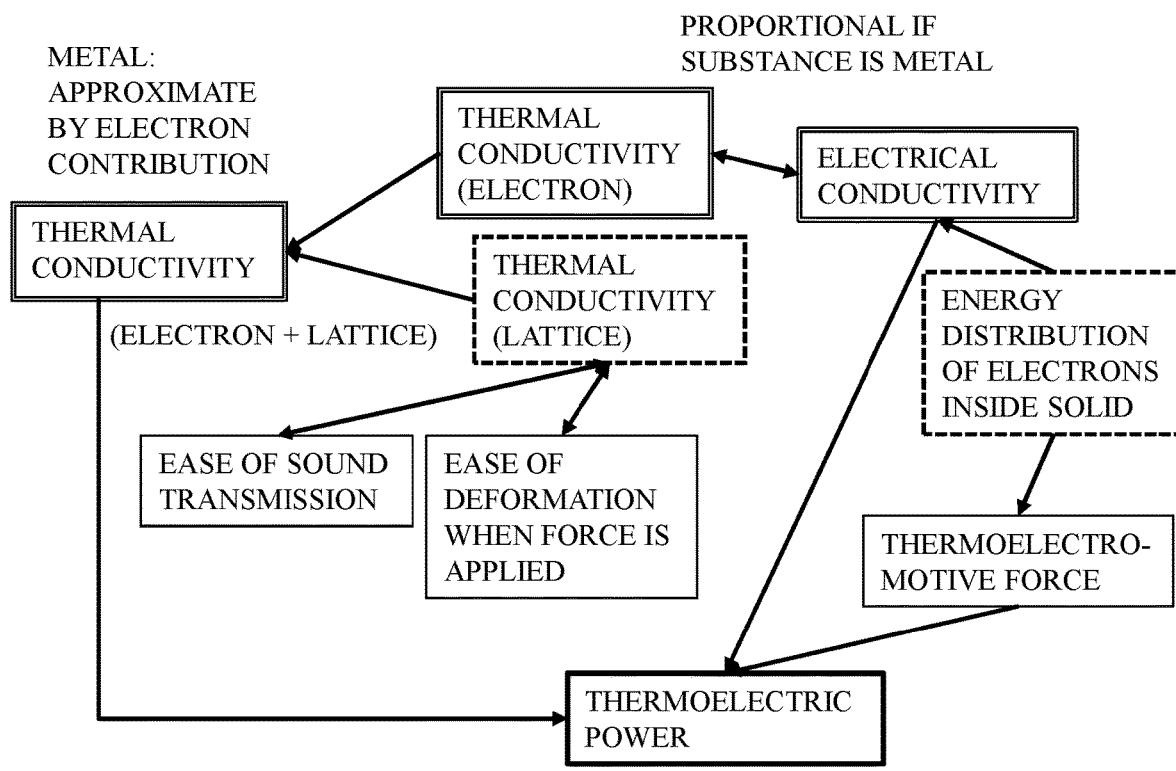
FIG. 5 is an example of a generated graph in an embodiment.
Figure 6:
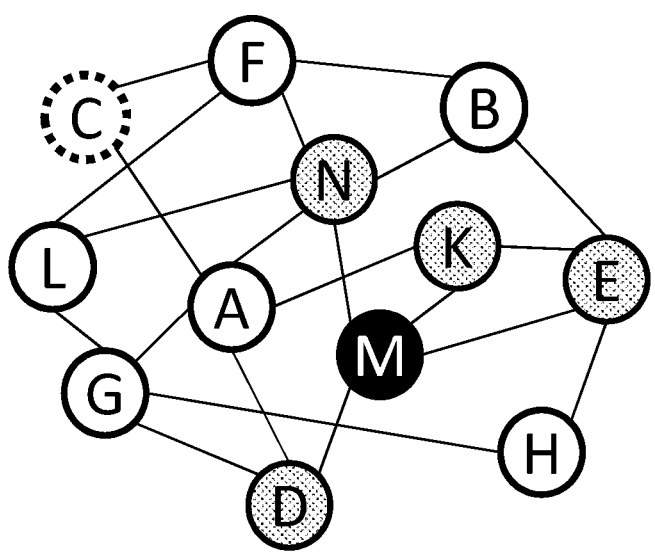
FIG. 6 is a graph illustrating presentation of highly relevant material properties.

The prioritized output results are roughly classified into the following two types. One of them is a path that indicates the relationship between target material properties. For example, regarding the relationship between "energy distribution of electrons inside solid" and "thermoelectric power" in the graph illustrated in FIG. 5, paths between the material properties are as follows:

(i) Energy distribution of electrons inside solid→thermal electromotive force→thermoelectric power (ii) Energy distribution of electrons inside solid→electric conductivity→thermoelectric power (iii) Energy distribution of electrons in the solid→electric conductivity→→thermal conductivity (electrons)→thermal conductivity→thermoelectric power Here, these paths will be prioritized. The other is presentation of highly relevant material properties. Regarding a graph, nodes with high priority are presented. At this time, the number of paths of the search path may be limited. For example, regarding "energy distribution of electrons inside solid" in FIG. 5, related material properties thereof may include "electrical conductivity," "thermal electromotive force," "thermoelectric power," and "thermal conductivity" and these related material properties are presented with priority in the order of descending priorities. As an example of node presentation with limited number of search paths, a graph illustrated in FIG. 6 in which each material property is abstracted by A, B, C, etc. will be described. For example, D, E, K, and N, connected to the material property M via one edge, A, B, F, G, H, K, and L, connected to the material property M via two edges, and A, B, D, E, F, G, H, K, L, and N connected to the material property M via at two or less edges are presented.

Evaluation Criteria for Prioritization

Evaluation Items

The evaluation items for prioritization are at least one of a reliability level, the number of edges, measurability of material properties, a data amount of a database of material property values, and material property values. Here, the contents of each item are as follows.

(a) Reliability level: indicating whether the relationship is strictly theoretical, semi-quantitative, qualitative or empirical.

(b) Number of edges: indicating the number of related material properties involved and the amount weighed thereto. Here, the number of related material properties corresponds to the number of arrows pointing into (indicated by −) an edge and out (indicated by +) of an edge, and an amount of weighting is a quantified attribute related to the length and thickness of the arrows of the edge.

(c) Measurability of material property value: indicating any of the followings: the material property value is measurable in principle and measurement method therefor exists; the material property value is measurable in principle but measurement method therefor is not known; and the material property value is not measurable in principle.

(d) Data amount in database of material property values: indicating an amount of the database stored in the database.

(e) Material property values: indicating values of the material property itself of the material property.

Among these, (a) is an attribute of edges, and (b) to (e) are attributes of nodes.

Evaluation Method

The evaluation methods for prioritization are roughly classified into the following two types: an item-by-item evaluation method for individually evaluating (b) to (e) of the above items that are node-related attributes, and a composite evaluation method for evaluating by combining at least two or more of the above items (a) to (e). Here, the composite evaluation method is classified into the following six priority types (courses) according to the method.

(i) Reliability level-focused priority (reliability level-focused course)

(ii) Control-focused priority (control-focused course)

(iii) Measured value-focused priority (measured value-focused course)

(iv) Data amount-focused priority (data amount-focused course)

(v) Material property (material)-limited priority (material property-limited course)

(vi) Universal priority (universal course)

Then, the evaluation items are scored and prioritized in order of the score. In each of these courses, an item-added score in which a score weighed to each item constituting each course is obtained, and prioritized in the order of the item-added scores. The method for weighting will be described in the detailed description of the embodiment below.

2. Detailed Description of Embodiment

The embodiments will be described in further detail.

First Embodiment

A search method according to a first embodiment will be described with reference to the drawings. A search system 101 includes a database 1 that stores relationships of material property parameters, a graph generation means 2, a graph search means 3, and a prioritization means 4 (see FIG. 2). The database 1 stores multiple pairs of material property parameters having mutual relationships. Which pairs of material property parameters mutually have relationships is not limited to those established theoretically, described in textbooks, and widely known, and the relationships may be not fully explained theoretically but empirically known, semi-quantitative, or qualitative. The graph generation means 2 generates a graph in which material property parameters stored in the database 1 are represented as nodes, and inter-nodes spaces corresponding to the respective material property parameter pairs having mutual relationships are represented as edges. The graph search means 3 searches the graph based on a given search condition. The prioritization means 4 prioritizes the searched paths or the related material properties based on the scores, and outputs the prioritized search result.

Therefore, the search system 101 can search, in order of priority, from among any combinations of the multiple material property parameters, a combination of material property parameters having a significant relationship therebetween, on the basis of known relationships. The search system 101 may collect pairs of material property parameters having mutual relationships to be stored in the database 1 that stores the relationships of material property parameters from as many technical fields as possible. The search system 101 collectively expresses the pairs of material property parameters in a single graph, whereby a path search covering the graph becomes possible. Here, a "single graph" is composed of multiple nodes and multiple edges, that are sides or branches, connecting the nodes, and all the nodes are directly or indirectly connected by any one of the edges. A single graph may be a collection of multiple graphs (sometimes referred to as a partial graph). Since expression by using the graph enables a search of paths based only on presence/absence of the edge irrespective of what kind of technical field the relationship corresponding to the edge has been known, search can be conducted across many fields. Therefore, it becomes possible to find an unknown combination of material property parameters having a significant relationship. Various path search methods based on mathematical algorithms can be applied to the graph search means 3. The prioritization means 4 will be described in detail later.

Preferably, the search system 101 may further include a database interface (not illustrated) and a user interface (not illustrated). The database interface supports management functions of the database 1 such as writing information about relationships of the material property parameters to the database 1, and reading and confirming the information stored in the database 1 thereafter. The search condition can be provided to the graph search means 3 through the user interface, and the search result can be output to the outside. Also, the system of priority (priority course) can be input to the prioritization means 4, and the path search results and the scores thereof arranged in order of priority and a list in which the material properties prioritized in the order of relationship level can be received.

A network interface is preferably provided together with the user interface. That is, a search system in which the search system 101 is connected to the network interface (not illustrated) and connected to the user interface (not illustrated) via the network interface is also preferable. When the user can access the search system 101 via the network, the search can be performed from a distance of the system, and there is an advantage that many users can use the search system.

The database interface and the user interface do not necessarily have to be limited to human interfaces, and may be interfaces to other databases and search systems.

Figure 7:
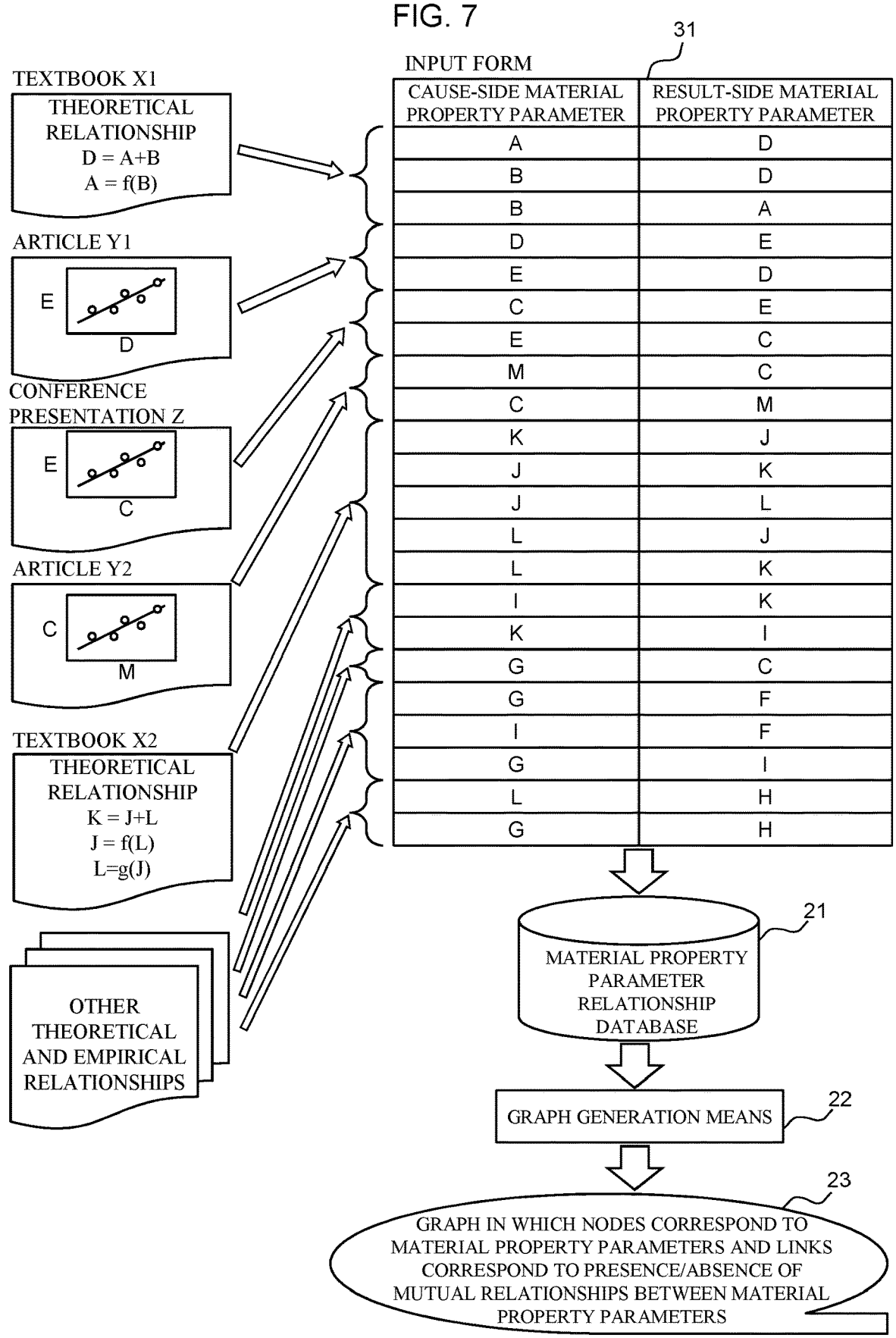
FIG. 7 is an explanatory diagram illustrating a configuration example of a database of a search system in the present invention.

The search method according to the first embodiment will be described in more detail. FIG. 7 is an explanatory diagram illustrating a configuration example of the database 1. As an example, an input form 31 of the database 1 is illustrated. The input form 31 is an expression form of edges, i.e., a table form in which each pair of material property parameters having mutual relationships are shown in each row. A first column is a cause-side material property parameter, and a second column is a result-side material property parameter. Although the material property parameters do not necessarily have to be divided into the cause-side and the result-side, there is an advantage that a relationship having directionality in causality can also be expressed. When there are bidirectional relationships, the relationships are described by using two rows in which the material property parameters on the cause-side and the result-side are exchanged.

As illustrated in FIG. 7, when "D=A+B" is formulated as a theoretical relationship in the textbook X1, the cause-side material property parameters are A and B, and the result-side material property parameter is D (the second row and a third row), when "A=f(B)" is formulated "f" is a function in which B is input and A is output, and when the inverse function is undefinable, the cause-side material property parameter is B and the result-side material property parameter is A (a fourth row). When an article Y1 shows that data (chart) indicating material property parameters D and E are in good correlation, the relationship is input in a fifth row and a sixth row. Similarly, when data (chart) indicating material property parameters C and E are in good correlation is presented in a conference Z, the relationship is input in a seventh row and an eighth row. Similarly, hereinafter, the relationship between material property parameters M and C shown in an article Y2 is input in a ninth row and a 10th row, the relationships between material property parameters K and J, K and L, J and L, and L and J derived from a theoretical formula shown in a textbook X2 is shown in an 11th row to a 15th row, and, in addition, the relationships between the material property parameters I and K, G and C, G and F, G and I, I and F, L and H, and G and H, which are known theoretically or empirically are input in a 16th row to a 23rd row, respectively.

The relationship between multiple pairs of material property parameters entered and input in the input form 31 is taken into the computer and stored as the database 1. The graph generation step S1 generates a graph in which the database 1 is input, each material property parameter is represented as a node, and presence/absence of mutual relationship among the material property parameters is represented as an edge. In FIG. 7, the input form 31 and the database 1 are depicted as clearly distinguished from each other, but the input form 31 may be referred to as the database 1. This is because if two sets of material property parameters (pairs) described on the same column of the input form 31 are prescribed as two nodes and an edge is prescribed between the two nodes, the information is substantially equivalent to a graph.

FIG. 8 illustrates an example of another input form 32 to the database 1. The input form 32 is an expression form of nodes, i.e., an expression form indicating the attributes of the material property nodes.

FIG. 4 illustrates an example of a case in which the graph to be generated is a directed graph. The graph may also be an undirected graph. However, a directed graph is more effective than an undirected graph in performing prioritization since priority scores can be given by using directions of edges in a directed graph.

Figure 9:
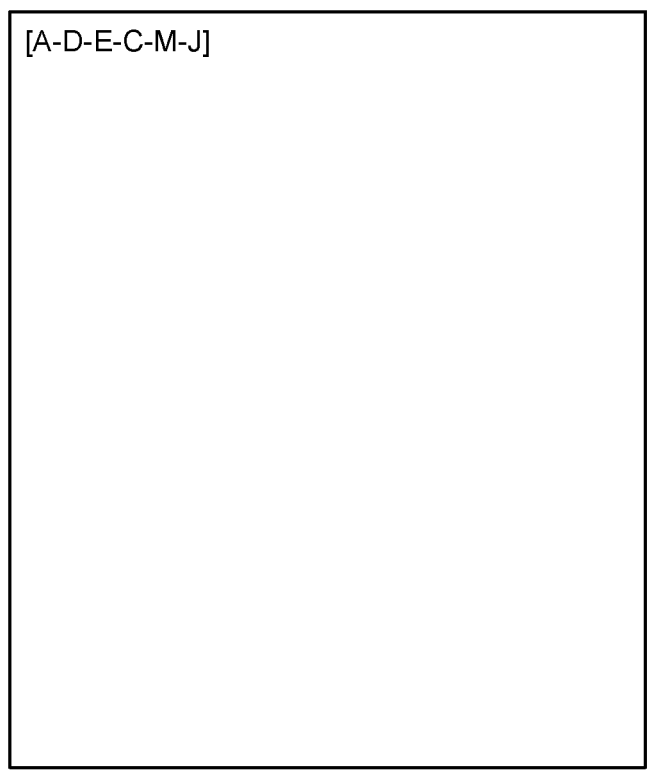
FIG. 9 is an explanatory diagram illustrating an example of a path search result of a directed graph.
Figure 10:
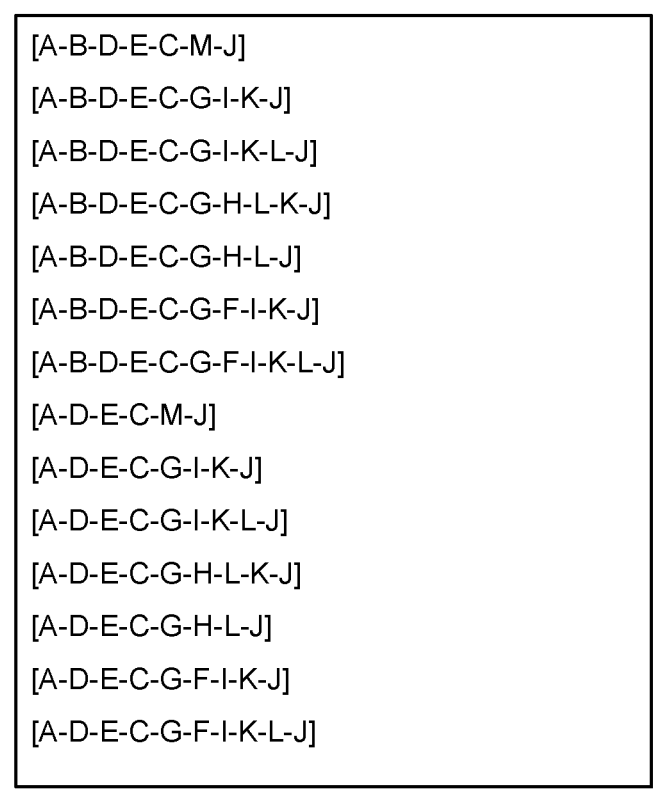

The graph search means 3 conducts a path search covering the graph under a given search condition. For example, if a user wishes to know presence/absence of a causal relationship with the material property parameter A being a cause-side and J being a result-side, the graph search means 3 is given a search condition where a node A is set to be a start point and a node J is set to be an end point, and is then made to conduct a path search. As a result, in a case of the directed graph illustrated in FIG. 4, a path search result as illustrated in FIG. 9 is obtained, and in a case of the undirected graph illustrated in FIG. 4, a path search result as illustrated in FIG. 10 is obtained.

The search condition to be given to the graph search means 3 may be arbitrarily changed in addition to that described above: setting the start point and the end point. As a search condition, for example, an end point and the number of nodes to reach the end point may be designated, and the graph search means 3 may be controlled to list all the paths of which length to the end point is within the number of nodes. In this manner, material property parameters having a relatively strong relationship with a specific material property parameter can be comprehensively listed.

The textbooks X1 and X2, the articles Y1 and Y2, and the conference presentation Z are textbooks, articles, conference presentations etc. preferably in completely different fields. Therefore, the relationship between the material property parameters A and D known in the textbook X1, the relationship between the material property parameters D and E known in the article Y1, the relationship between the material property parameters E and C known in the conference presentation Z, the relationship between the material property parameters C and M known in the article Y2, and the relationship between the material property parameters M and J known in the textbook X2 may be followed in this order to obtain new knowledge that the material property parameters A and J have a relationship. Although the new relationship obtained here is a relationship that can exist merely mathematically and it may be necessary to determine whether that relationship is an actually valid relationship after physical evaluation, such a relationship is worth providing at least notice to researchers who are users.

The format of the input form 31 illustrated in FIG. 7 is illustrative only, and may be arbitrarily changed or other information may be added. For example, when the graph that is a search range is an undirected graph, it is unnecessary to distinguish the cause-side and the result-side regarding the pair of material property parameters, so two mutually related material property parameters may be written in a random order in each column. Therefore, storage capacity of the storage device for storing the database 1 and the graph can be reduced smaller than in the case of the directed graph. Even in a directed graph, in the input form 31, following the description of two parameters, information indicating bidirectional, forward or reverse direction may be described as the relationship.

Other information to be added to the database 1 may include, for example, the reliability of the relationship of the pair of material property parameters or a reliability level that is numerical information of the reliability. A theoretically proved and widely recognized relationship is significantly reliable. However, when a relationship for which experimental data showing existence of correlation between two material property parameters has been obtained, but data on additional experiments for confirming reproducibility has not yet been obtained, and a theoretical explanation explaining the relationship is merely a hypothesis, a relationship is semi-quantitative, or when a relationship is qualitative, a reliability level of the relationship may desirably be considered to be low. Reliability information that is the basis of such a reliability level may be additionally input in the database 1, associated with the length of the edge in the graph, and treated as a distance of the path in the graph search means 3, for example. For example, the length of an edge with high a reliability level is set to 1, and as the reliability level becomes lower, the longer edges may be associated like 2, 3, 4, and so on. Since the priority becomes lower as the edge becomes longer, the score of the priority may be a value between 0 and 1 in which 1 is given when a reliability level is theoretically proven and established, and 0 is given when there is no reliability level. The scoring may be performed by giving, for example, the inverse of the length of the edge.

In the first embodiment, the database 1 and the graph are distinguished from each other, but alternatively the graph itself may be managed as a graph type database. In general, a "database" is a collection of data grouped together that allows multiple users to use. The database can be categorized into several types: a hierarchical database, a networked database, and a relational database. However, the database 1 in the present invention may be of any type. It is sufficient that the database 1 of the present invention contains at least data constituting the graph, that is, the relationship between the material property parameter corresponding to each node and the pair of material property parameters corresponding to the edge as an aggregate of data, or the database 1 may be composed only of a collection of data constituting the graph.

In that case, the constituent element, the database 1, may be omitted and an access may be enabled, from the database interface via the graph generation means 2, to a graph in which each material property parameter is a node and a relationship between the material property parameters are an edge. Here, the graph at this time is regarded as a form of a database. Here, a database of this form will be referred to as a "graph type database." This is because the graph type database acts as a range of a path search, etc. by using a graph theory.

Next, prioritization will be described. As described above, the individual items for evaluation of priority include a reliability level, the number of edges, measurability of material properties, a data amount of a database of material property values, and material property values. These items are scored to be given priority. The score for each path when the path has passed through multiple nodes is a value obtained by adding the scores of the nodes and edges that constitute the path and then dividing by the number of nodes that constitute the path excluding the starting point. The priority is determined in descending order of the score, but when the scores are the same, the one that has passed a smaller number of nodes or having a shorter path is prioritized. On the other hand, the score when the path has passed through multiple nodes may be set to the addition of the scores of the nodes and the edges constituting the path, and the descending order of the added scores may be set to the priority. With this method, a relatively long path is likely to be prioritized. Therefore, this method is suitable to extract information between material properties of which relationship is not known. When the priority is determined by using any one of the evaluation items, the priority is determined with the score of only the selected item. Here, scoring of the individual item is as follows.

(a) Reliability level: a reliability level is an amount depending on whether the relationship is strictly theoretical, semi-quantitative, qualitative or empirical, a number between 0 and 1 is given with the higher reliability level being closer to 1. For example, when the relationship is strictly theoretical, the score is 1, when the relationship is semi-quantitative, the score is 0.7, when the relationship is qualitative, the score is 0.4, and when the relationship is empirical, the score is 0.2.

(b) Number of edges: the number of edges is a value obtained by subtracting the number of edges entering the material property (the node) from the number of the edges exiting the material property (the node). The number of edges entering the material property and the number of edges exiting the material property are the following numbers weighed and added according to the length and thickness of each arrow.

Number of edge s=(number of exiting edges)−(number of entering edges)

Number of exiting edges=Σ(exiting edges weighed)

Number of entering edge s=Σ(entering edges weighed)

Figure 11:
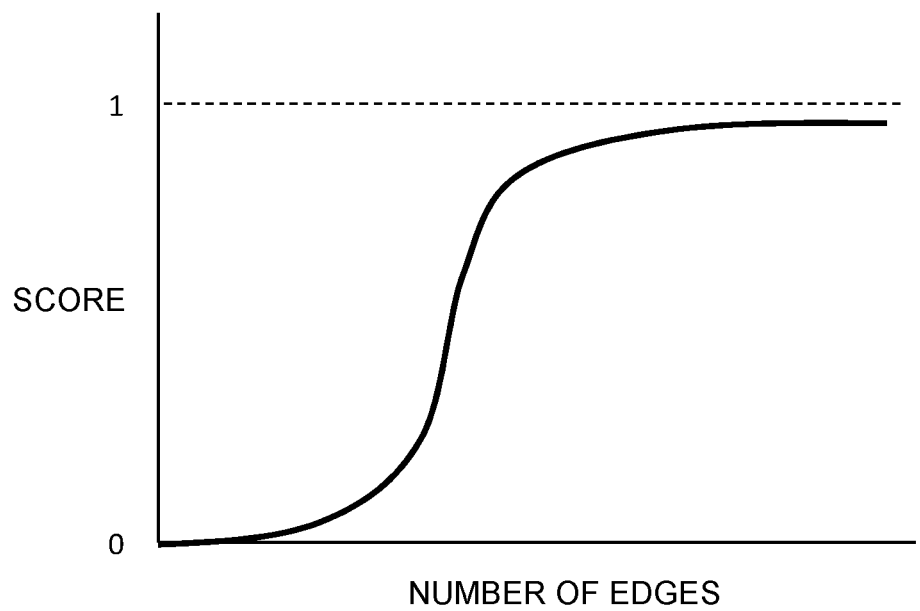
FIG. 11 is a characteristic diagram illustrating a score for the number of edges.

Since the number of edges entering the material property is large, the material property is easily affected by other factors, and stability is low from the viewpoint of the relationship and, therefore, the score is subtracted. The score is a number given by an S-shaped curve having a value between 0 and 1 with the number of edges as a variable. In this S-shaped curve, as illustrated in FIG. 11, when the number of edges is 0, the score is 0, as the number of edges increases, the score gradually increases at the beginning, and after that, through a region in which the score rises sharply, the score saturates to 1. Mathematically, this curve can be approximately expressed by using a sigmoid function.

(c) Measurability of material property value: measurability of a material property value is scored in three types of: the material property value is measurable in principle and measurement method therefor exists; the material property value is measurable in principle but measurement method therefor is currently not known; and the material property value is not measurable in principle. The scores of between 0 and 1 are given, with the upper limit of the measurability being 1. For example, when the material property value is measurable in principle and measurement method therefor exists, the score is 1, when the material property value is measurable in principle but measurement method therefor is currently not known, the score is 0.4, and when the material property value is not measurable in principle, the score is 0.

(d) Data amount in database of material property values: when a data amount (number of data) in a database of the material property values is n, the score of the data amount in the database of the material property values is a value given by an S-shaped curve that can be approximately expressed by using a sigmoid function mathematically. The score is between 0 and 1 with the number of data n being a variable.

(e) Material property values: when the user designates a numerical range of the material property values as μ±σ, the score is calculated from the normal distribution probability density based on the range. More specifically, the score of the material property value is a numerical value obtained by normalizing a normal distribution probability density function in a range between 0 and 1 with μ as a center and o as a standard deviation.

On the other hand, when determining priority by composite evaluation by using any two or more of the evaluation items, the total score (hereinafter, also referred to as "point") is obtained as follows and the priority is determined in the descending order of the total score.

When the scores of the items of the reliability level, the number of edges, the measurability of material property values, the data amount of the database of material properties, and the material property values are $S_a$, $S_b$, $S_e$, $S_i$, and $S_e$, and the weighting coefficients of the items are $\alpha_a$, $\alpha_b$, $\alpha_c$, $\alpha_d$, and $\alpha_e$, respectively, the total score $S_T$ is prescribed by the following equation (1):

$$S_T = \alpha_a \cdot S_a + +_b \cdot S_b + \alpha_e \cdot S_e + \alpha_d \cdot S_d \alpha_e \quad \text{(equation 1)}$$

Then, the value of the weighting factor is adjusted in accordance with each of the—focused priority (each of the focused course). Here, the guidelines for adjusting the weighting factors are as follows.

(i) Reliability level-focused course: $\alpha_a > \alpha_c \gg \alpha_b \approx \alpha_d$, $\alpha_e = 0$ (ii) Control-focused course: $\alpha_b > \alpha_c \approx \alpha_d \approx \alpha_a \approx \alpha_e$ (iii) Measured value-focused course: $\alpha_e > \alpha_d > \alpha_a \approx \alpha_b \approx \alpha_e$ (iv) Data amount-focused course: $\alpha_c \cdot \alpha_d \gg \alpha_a \approx \alpha_b \approx \alpha_e$ (v) Material property-limited course: $\alpha_c \cdot (\alpha_e \gg \alpha_a > \alpha_b \approx \alpha_d)$ (vi) Universal course: $\alpha_a \approx \alpha_b \approx \alpha_c \approx \alpha_d \approx \alpha_e$ As is known from above, each of these courses weighs the items to be focused. In the material property-limited course, since actual measurement is focused, the score is multiplied by $\alpha_e$. When the material property is unmeasurable, the total score is set to be 0. In the universal course, weight of each item is almost equal.

Second Embodiment

Presence/absence or contents of a relationship between some pairs of material property parameters may change depending on conditions. For example, a tensile strength and a Vickers hardness are proportional to each other on condition that the materials are transition metal carbides. This is because the tensile strength of the transition metal carbide is determined by the shear strength, where the tensile strength and the Vickers hardness are in a proportional relationship, when the tensile strength is determined by the shear strength. Also, there is a relationship between the tensile strength and the the bonding potential depth on condition that it is a substance not exhibiting superplasticity. Therefore, in searching for a relationship between the material property parameters, it is necessary to determine presence/absence of a path and a distance by taking such conditions into consideration.

In order to treat a conditional relationship of the pair of material property parameters, it is possible to solve by changing the graph search step S2 and the graph search means 3 to software implementing a graph search algorithm capable of handling a conditional edge. It is therefore possible to deal with the conditional relationship as it is without changing the configuration of FIG. 1 and FIG. 2.

On the other hand, incorporating such a condition determination into a general graph search sometimes is not always an appropriate solution. Purely mathematical algorithms have been established for path searching of graphs, and software libraries implementing them have already been provided.

In the present invention, by mapping the relationship of the material property parameters to the graph, it has become possible to use various kinds of search algorithms based on such general graph theory. For this reason, software libraries implementing such a graph search algorithm are extremely consistent when applied to the graph search step S2 and the graph search means 3 of the present invention, and many software libraries are applicable to the graph search step S2 and the graph search means 3 as they are.

On the contrary, limited types of software libraries implementing a graph search algorithm supporting the conditional edges as described above can be applied to the graph search step S2 and the graph search means 3 of the present invention as they are. Adding a condition determination function to a software library implementing a general graph search algorithm requires a number of man-hours for programming to be added, and there will be an increased risk of incorporating program bugs.

FIG. 3 is a flowchart illustrating the step of the search method according to the second embodiment. As compared with the search method illustrated in FIG. 1, the method further includes a condition extraction step S11 and a path evaluation step S12. Regarding the pair of material property parameters for which a condition for prescribing presence/absence of a relationship exists among the multiple pairs of material property parameters having mutual relationships in the database 1, the condition is further stored in the database 1. In the condition extraction step S11, the condition is extracted from the database 1 in association with an edge corresponding to a pair of which presence/absence of a relationship is prescribed by the condition (conditional edge). The graph search step S2 conducts the path search of the graph and outputs the search result, but presence/absence of the conditional edge is not considered at this time. The path evaluation step S12 determines whether a conditional edge is included in the extracted path and determines whether the condition is satisfied for a path including a conditional edge. When the condition is not satisfied, the path including a conditional edge but not satisfying the condition is excluded from the result output from the graph search step S2, and output the paths as a search result before prioritization.

Therefore, even a complicated relationship such that presence/absence of a relationship changes depending on a value of material property parameter corresponding to the relationship or a value of another material property parameter can be included in a search range. On the other hand, the graph search step S2 does not necessarily have to additionally have a function to search a graph including conditional edges, and general graph search software can be applied in exactly the same way as in the first embodiment. In the present embodiment, a conditional edge has been described using a directed graph as an example, but an embodiment including conditional edges may also be implemented in an undirected graph.

FIG. 12 is an explanatory diagram illustrating an example of an input form 33 for configuring the database 1 of the search system 101. Compared with the example of the input form 31 illustrated in FIG. 7, presence/absence of a relationship, a relationship memo, a relationship category 1, a relationship category 2, a condition node, a condition, and a relationship are added. The relationship category may be, for example, reliability level information described in the first embodiment. When a condition is a value (content) of a specific material property parameter, the condition node describes a node corresponding to the material property parameter, and the value or content thereof is described in the condition.

If the relationship is formulated, the formula is described in the relationship, and if the relationship is semi-quantitative or empirical, an approximate expression thereof is described in the relationship. A qualitative relationship may be described in place of a formula or by mixed with a formula prescribed for a pair of material property parameters. For example, whether there is a positive correlation or a negative correlation may be described. By using all the expressions on a path in the search results, newly found relationships in pairs of material property parameters can be formulated. When a qualitative relationship is included in a path as a search result, a newly found qualitative relationship in a pair of material property parameters can be found. For example, in the path illustrated in FIG. 9, in order to increase the material property parameter J, a suggestion to change the substance into a substance having a smaller material property parameter A can be obtained.

As described above, in the database 1, in addition to a simple relationship, information indicating a reliability level of a relationship, a condition for prescribing presence/absence or content of a relationship, an expression indicating a relationship, or a qualitative relationship can be further included. These pieces of information can be used for the path search in the graph search step S2 or can be supplied to the path evaluation step S12 via the condition extraction step S11 to be used as additional information of the extracted path. Then, these pieces of information can be prioritized by the method illustrated in the first embodiment based on the advanced relationship.

Third Embodiment

Figure 13:
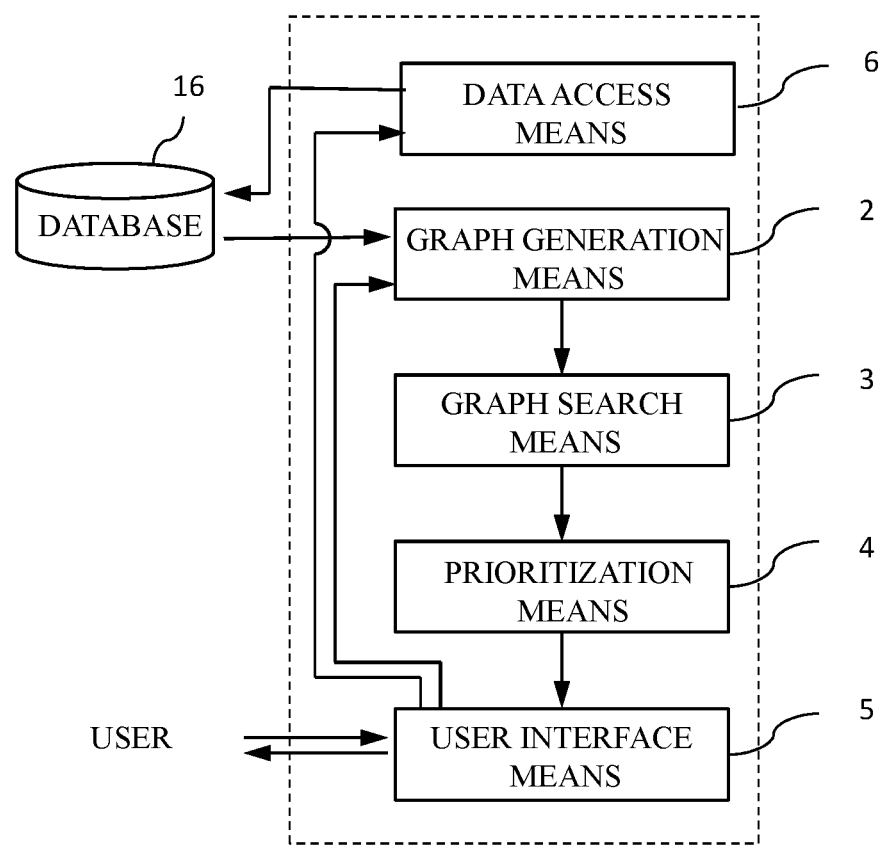
FIG. 13 is a block diagram illustrating a configuration of a search device of the present invention.

In the third embodiment, a search device 102 will be described with reference to FIG. 13. The search device 102 includes a graph generation means 2, a graph search means 3, a prioritization means 4, a user interface means 5, and a data access means 6. In the search device 102, the user interface means 5 receives instructions from a user. Then, the user interface means 5 instructs the data access means 6 to access a database 16 provided outside to obtain data about necessary material properties. The data access means 6 acquires necessary data from the database 16 and transmits acquired data to the graph generation means 2. According to the above steps, the graph search means 3 searches the graph, and the search results prioritized by the prioritization means 4 are provided to the user through the user interface means 5. The material property data may be acquired by any methods by the data access means, such as via a network, by using a medium like a disc, etc.

In the search device 102, the database 16 is provided outside the search device 102. A large amount of data regarding material properties, which is big data, can be operated more efficiently if placed as an external shared facility than placed in an individual search device.

When connecting the database 16, in which information about individual material property parameters and information about multiple pairs of material property parameters having mutual relationship are stored, with multiple search devices 102 via the Internet, etc., many users can use the database 16, which increases the efficiency of database utilization.

In the search device 102 described above, the material property data is sequentially obtained by the data access means 6 from a database provided outside the search device 102. However, a data storage means (not illustrated) may further be provided inside the search device 102. The data storage means stores multiple material property parameters acquired from the external database 16 by the data access means 6. In this method, material property data related to the search for the purpose can be stored collectively, so that the number of accesses to the outside is reduced, and the efficiency in data access is increased.

The search device may include a database storing physical parameters, a graph generation means, a graph search means, a prioritization means, and a user interface means. Since a database is provided internally, data access efficiency of this device is further improved.

Although the present invention made by the inventors has been described in detail based on the embodiments, the invention is not limited to the same, and may be changed in various ways without departing from the concept and scope thereof.

EXAMPLES

Example 1

Figure 14:
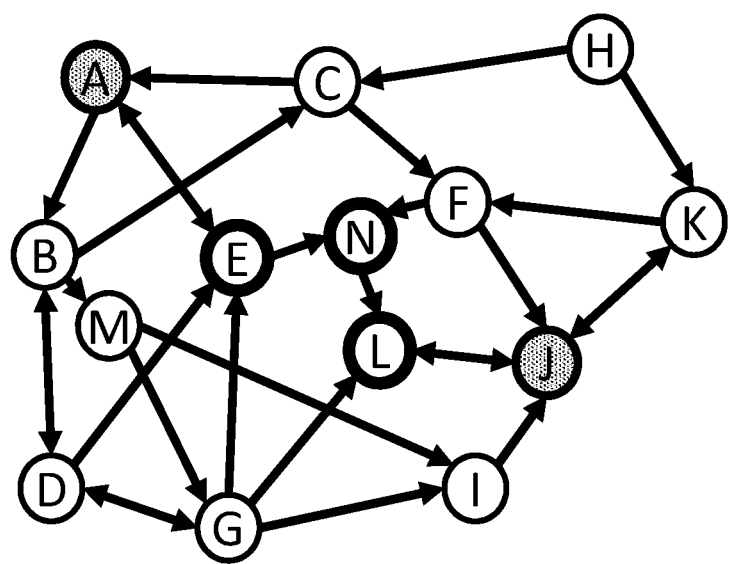
FIG. 14 is a diagram illustrating a graph in Example 1.

In Example 1, an example of a method for prioritizing paths A to J in the graph illustrated in FIG. 14 when the number of edges is the item with which priority is determined will be described. Here, all the weightings are 1. The number of edges at each node in that case is as follows.

B: 3−2=1, C: 2−2=0, D: 3−2=1, E: 2−3=−1, F: 2−2=0, G: 4−2=2, H: 2−0=2, I: 1−2=−1, K: 2−2=0,
L: 1−2=−1, M: 2−1=1, N: 1−2=−1

There are 12 paths from A to J. For each path, the nodes are calculated as follows by using the above-described number of edges.

A→B→C→F→J: 1+0+0=1
A→B→C→F→N→L→J: 1+0+0−1−1=−1
A→B→M→G→E→N→L→J: 1+1+2−1−1−1=1
A→B→M→G→I→J: 1+1+2−1=3
A→B→M→G→L→J: 1+1+2−1=3
A→B→M→G→D→E→N→L→J: 1+1+2+1−1−1−1=2
A→B→M→I→J: 1+1−1=1
A→B→D→G→E→N→L→J: 1+1+2−1−1−1=1
A→B→D→G→I→J: 1+1+2−1=3
A→B→D→G→L→J: 1+1+2−1=3
A→B→D→E→N→L→J: 1+1−1−1−1=−1
A→E→N→L→J: −1−1−1=−3

Values obtained by dividing these values by the number of nodes constituting the paths (the number of nodes excluding the starting point) are as follows. Here, the values are rounded to the third decimal place for the ease of viewing.

A→B→C→F→J: 1/4=0.25
A→B→C→F→N→L→J: −1/6=−0.167
A→B→M→G→E→N→L→J: 1/7=0.143
A→B→M→G→I→J: 3/5=0.6
A→B→M→G→L→J: 3/5=0.6
A→B→M→G→D→E→N→L→J: 2/8=0.25
A→B→M→I→J: 1/4=0.25
A→B→D→G→E→N→L→J: 1/7=0.143
A→B→D→G→I→J: 3/5=0.6
A→B→D→G→L→J: 3/5=0.6
A→B→D→E→N→L→J: −1/6=−0.167
A→E→N→L→J: −3/4=−0.75

When the scores are the same, a path with a smaller number of nodes is prioritized. The paths are prioritized in the descending order of scores as follows.

[1]A→B→M→G→I→J: Score=0.6
[1]A→B→M→G→L→J: Score=0.6
[1]A→B→D→G→I→J: Score=0.6
[1]A→B→D→G→L→J: Score=0.6
[5]A→B→C→F→J: Score=0.25
[5]A→B→M→I→J: Score=0.25
[7]A→B→M→G→D→E→N→L→J: Score=0.25
[8]A→B→M→G→E→N→L→J: Score=0.143
[8]A→B→D→G→E→N→L→J: Score=0.143
[10]A→B→C→F→N→L→J: Score=−0.167
[10]A→B→D→E→N→L→J: Score=−0.167
[12]A→E→N→L→J: Score=−0.75

In this manner, the priority when the number of edges is the item with which priority is determined is provided.

Example 2

In the first embodiment, the embodiment is described with material property parameters abstracted, such as A, B, C, etc., and in the second embodiment, an example in which specific parameters are applied to the material property parameters will be described. FIG. 15 is a detailed explanatory diagram illustrating an example of the input form 31 regarding edge information of the database 1. In this example, the reliability level is input as numerical values in the item "Relationship category 1." When there is no relationship, the reliability level=0. When there is a theoretically established relationship, the reliability level=0.4 or 0.7 depending on the reliability level. A relationship based on a correlation obtained by a theoretical deduction or an experiment is expressed as the reliability level=1.

From the knowledge in the field of surface physics, presence/absence of mutual relationships are prescribed between a work function and surface terms thereof, bulk terms thereof, and surface dipole, surface charge distribution, and Fermi level depth. The relationship between the Fermi level depth and the bonding potential depth is derived in a deducible manner based on a chemical bonding theory. The relationship between composition and presence/absence of surface segregation, and the relationship between surface composition and bulk composition are based on surface thermodynamics. The relationship among a tensile strength, a Vickers hardness and a bonding potential depth is based on material mechanics, and the relationship between bulk composition and a Fermi level depth are based on solid physics. Further, the relationship between a tensile strength and a bonding potential depth is found when a condition 1 that "a material does not exhibit superplasticity" is satisfied. Between a tensile strength and a Vickers hardness, a condition 2 of "a proportional relationship if the material is transition metal carbide" is prescribed. In this manner, knowledge related to edges in many fields is consolidated in a single database 1.

Figure 17:
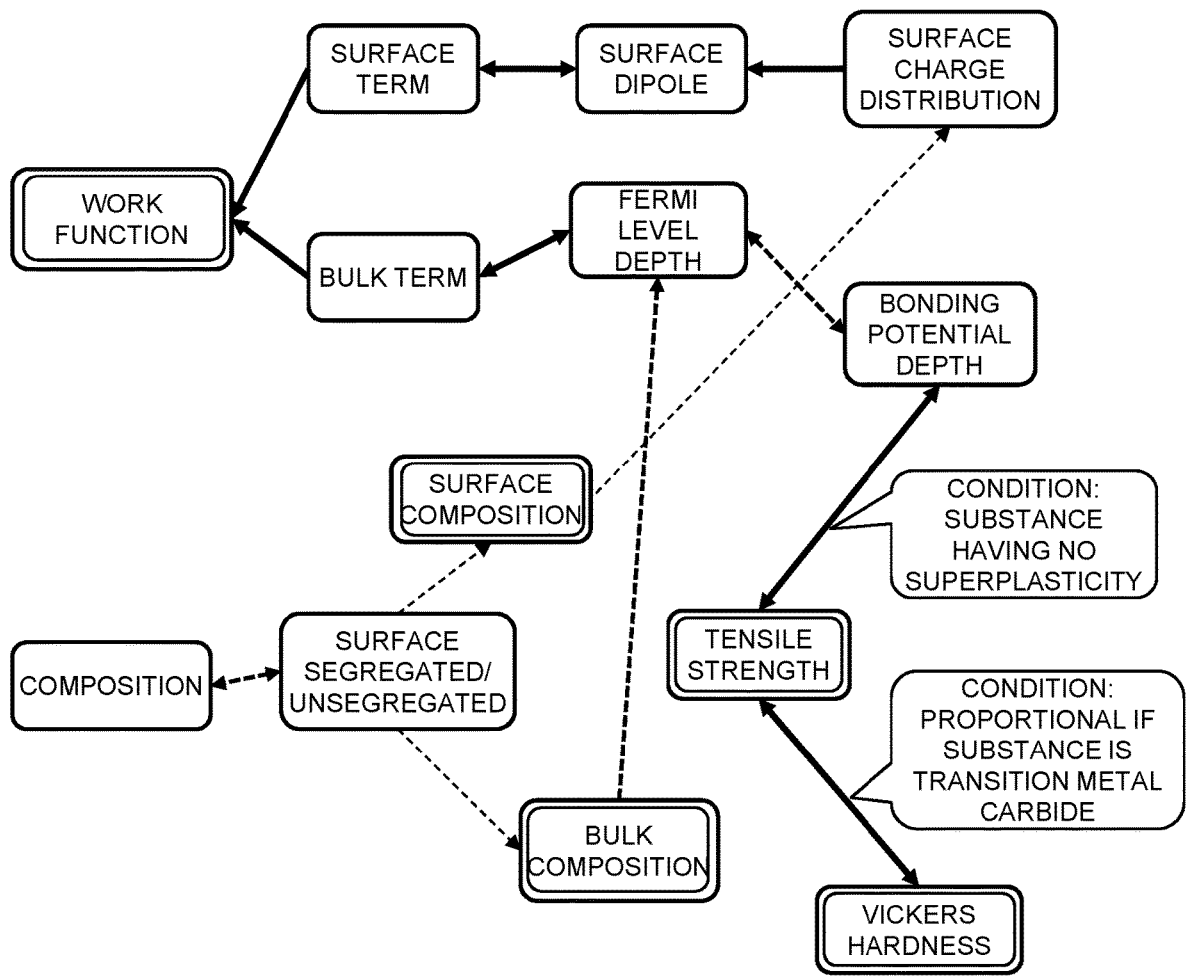
FIG. 17 is a generated graph corresponding to FIG. 15.

An input form 35 illustrated in FIG. 16 is an explanatory diagram illustrating an example of the input form 31 regarding node information of material properties illustrated in FIG. 15. The input form 35 is a table listing material properties which are nodes of which an item with which priority is determined, e.g., the number of edges, is scored. FIG. 17 illustrates a graph generated based on an input form 34 related to the edge information illustrated in FIG. 15 and the input form 35 related to the node information illustrated in FIG. 16. FIG. 17 is a directed graph in which a cause-side material property parameter is a starting point and a result-side material property parameter is an end point. Edges of reliability level=0.4 and 0.7 are illustrated by broken lines, and edges of reliability level=1 are illustrated by solid lines. Since reliability level=0 has no relationship, there is no corresponding edge. Since the conditions 1 and 2 do not belong to either the node or the edge of the graph, the conditions 1 and 2 are illustrated in association with corresponding edges with which relationship is prescribed. Measurable material property parameters are illustrated with double border lines.

It is found that there is a relationship between a Vickers hardness and a work function by conducting a path search through the graph. The path is: a Vickers hardness—a tensile strength—a bonding potential depth—a Fermi level depth—a bulk term of a work function—a work function. This path represents a cross-field relationship which can be found for the first time when searching across the fields of knowledge in the material mechanics, knowledge in the chemical bonding theory, and knowledge in the surface physics. As described above, the search method and the search system 101 of the present invention collectively expresses knowledge of multiple different fields in a single graph and enables searching of paths across the fields, whereby a user can find existence of relationship(s) across fields between material property parameters which seemingly have no relationship.

Next, the material properties related to a composition are searched in order of priority with the composition being a starting material property. Here, with the composition being a starting material property, related material properties regarding paths with up to 5 nodes configuring the paths without including a starting point are obtained, and the related material properties are prioritized. First, the following eleven paths are listed as paths.

(a) Composition→surface segregated/unsegregated (b) Composition→surface segregated/unsegregated→surface composition (c) Composition→surface segregated/unsegregated→bulk composition (d) Composition→surface segregated/unsegregated→surface composition→surface charge distribution (e) Composition→surface segregated/unsegregated→bulk composition→Fermi level depth (f) Composition→surface segregated/unsegregated→surface composition→surface charge distribution→surface dipole (g) Composition→surface segregated/unsegregated→bulk composition→Fermi level depth→bonding potential depth (h) Composition→surface segregated/unsegregated→bulk composition→Fermi level depth→bulk term (i) Composition→surface segregated/unsegregated→surface composition→surface charge distribution→surface dipole→surface term (j) Composition→surface segregated/unsegregated→bulk composition→Fermi level depth→bulk term→work function (k) Composition→surface segregated/unsegregated-→bulk composition→Fermi level depth→bonding potential depth→tensile strength Next, priority is determined in the reliability level-focused course. The score $S_a$ of each of the reliability levels (a) to (k) by using data of the input form 34 is as follows. Here, the score is a value rounded to the third decimal place.

(a) 0.7
(b) (0.7+0.4)/2=0.55
(c) (0.7+0.4)/2=0.55
(d) (0.7+0.4+0.4)/3=0.5
(e) (0.7+0.4+0.7)/3=0.6
(f) (0.7+0.4+0.4+1)/4=0.625
(g) (0.7+0.4+0.7+0.7)/4=0.625
(h) (0.7+0.4+0.7+1)/4=0.7
(i) (0.7+0.4+0.4+1+1)/5=0.7
(j) (0.7+0.4+0.7+1+1)/5=0.76
(k) (0.7+0.4+0.7+0.7+1)/5=0.7

The score of the number of edges $S_b$ is as follows.
(a) (0+0)/2=0
(b) (0+0+0)/3=0
(c) (0+0+0)/3=0
(d) (0+0+0+0)/4=0
(e) (0+0+0+0)/4=0
(f) (0+0+0+0+0)/5=0
(g) (0+0+0+0+0)/5=0
(h) (0+0+0+0+0)/5=0
(i) (0+0+0+0+0+0)/6=0
(j) (0+0+0+0+0−2)/6=−0.333
(k) (0+0+0+0+0+0)/6=0

The score $S_c$ of measurability is as follows.
(a) (1+1)/2=1
(b) (1+1+1)/3=1
(c) (1+1+1)/3=1
(d) (1+1+1+0.4)/4=0.85
(e) (1+1+1+0.4)/4=0.85
(f) (1+1+1+0.4+0.4)/5=0.76
(g) (1+1+1+0.4+0.4)/5=0.76
(h) (1+1+1+0.4+0.4)/5=0.76
(i) (1+1+1+0.4+0.4+0.4)/6=0.7
(j) (1+1+1+0.4+0.4+1)/6=0.8
(k) (1+1+1+0.4+0.4+1)/6=0.8

The score $S_d$ of the data amount in the database is as follows.
(a) (0.9+0.5)/2=0.7
(b) (0.9+0.5+0.5)/3=0.633
(c) (0.9+0.5+0.9)/3=0.767
(d) (0.9+0.5+0.5+0.1)/4=0.5
(e) (0.9+0.5+0.9+0.1)/4=0.6
(f) (0.9+0.5+0.5+0.1+0.1)/5=0.42
(g) (0.9+0.5+0.9+0.1+0.1)/5=0.5
(h) (0.9+0.5+0.9+0.1+0.1)/5=0.5
(i) (0.9+0.5+0.5+0.1+0.1+0.1)/6=0.367
(j) (0.9+0.5+0.9+0.1+0.1+0.2)/6=0.45
(k) (0.9+0.5+0.9+0.1+0.1+0.9)/6=0.567

In the reliability level-focused course here, the total score $S_{T\text{-}Reliability}$ is obtained by using the equation 1 described above with a weight $\alpha_a$ of a reliability level being 1, a weight ab of the number of edges being 0.01, a weight $\alpha_e$ of measurability being 0.5, a weight as of a data amount in a database of material property values being 0.01, and a weight ae of material property values being 0.

The result of the paths of the reliability level-focused course prioritized in order of the total scores is as follows.

[1]: (a) Composition→surface segregated/unsegregated: total score $S_{T\text{-}Reliability}$=1.207

[2]: (j) Composition→surface segregated/unsegregated→bulk composition→Fermi level depth→bulk term→work function: total score $S_{T\text{-}Reliability}$=1.161

[3]: (k) Composition→surface segregated/unsegregated→bulk composition→Fermi level depth→bonding potential-depth>tensile strength: total score $S_{T\text{-}Reliability}$=1.106

[4]: (h) Composition→surface segregated/unsegregated→bulk composition→Fermi level depth→bulk term: total score $S_{T\text{-}Reliability}$=1.085

[5]: (c) Composition→surface segregated/unsegregated→bulk composition: total score $S_{T\text{-}Reliability}$=1.058

[6]: (b) Composition→surface segregated/unsegregated→surface composition: total score $S_{T\text{-}Reliability}$=1.056

[7]: (i) Composition→surface segregated/unsegregated→surface composition→surface charge distribution→surface dipole→surface term: total score $S_{T\text{-}Reliability}$=1.054

[8]: (e) Composition→surface segregated/unsegregated→bulk composition→Fermi level depth: total score $S_{T\text{-}Reliability}$=1.031

[9]: (g) Composition→surface segregated/unsegregated→bulk composition→Fermi level depth→bonding potential depth: total score $S_{T\text{-}Reliability}$=1.01

[10]: (f) Composition→surface segregated/unsegregated→surface composition→surface charge distribution→surface dipole: total score $S_{T\text{-}Reliability}$=1.009

[11]: (d) Composition→surface segregated/unsegregated→surface composition→surface charge distribution: total score $S_{T\text{-}Reliability}$=0.93

In the manner described above, the priority in the reliability level-focused course is provided.

Example 3

In Example 3, the priority of the control-focused course is determined by using the data of Example 2, that is, the input data forms 34 and 35. In the control-focused course here, the total score $S_{T\text{-}control}$ is obtained by using the equation 1 described above with a weight $\alpha_a$ of a reliability level being 0.3, a weight $\alpha_b$ of the number of edges being 1, a weight $\alpha_c$ of measurability being 0.5, a weight $\alpha_d$ of a data amount in a database of material property values being 0.5, and a weight $\alpha_e$ of material property values being 0.3. Since the scores $S_e$ of the material property values are not given in the input data form 35, all the score $S_e$ is set to be 0.

The result of the paths of the control-focused course prioritized in order of the total scores is as follows.

[1]: (a) Composition→surface segregated/unsegregated: total score $S_{T\text{-}Control}$=1.06

[2]: (c) Composition→surface segregated/unsegregated→bulk composition: total score $S_{T\text{-}control}$=1.048

[3]: (b) Composition→surface segregated/unsegregated→surface composition: total score ST-Control=0.98

[4]: (e) Composition→surface segregated/unsegregated→bulk composition→Fermi level depth: total score $S_{T\text{-}Control}$=0.905

[5]: (k) Composition→surface segregated/unsegregated→bulk composition→Fermi level depth→bonding potential-depth>tensile strength: total score $S_{T\text{-}Control}$=0.893

[6]: (h) Composition→surface segregated/unsegregated→bulk composition→Fermi level depth→bulk term: total score $S_{T\text{-}Control}$=0.84

[7]: (d) Composition→surface segregated/unsegregated→surface composition→surface charge distribution: total score $S_{T\text{-}Control}$=0.825

[8]: (g) Composition→surface segregated/unsegregated→bulk composition→Fermi level depth→bonding potential depth: total score $S_{T\text{-}Control}$=0.818

[9]: (f) Composition→surface segregated/unsegregated→surface composition→surface charge distribution→surface dipole: total score $S_{T\text{-}Control}$=0.778

[10]: (i) Composition→surface segregated/unsegregated→surface composition→surface charge distribution→surface dipole→surface term: total score $S_{T\text{-}Control}$=0.743

[11]: (j) Composition→surface segregated/unsegregated→bulk composition→Fermi level depth→bulk term→work function: total score $S_{T\text{-}Control}$=0.43

In the manner described above, the priority in the control-focused course is provided.

Example 4

In Example 4, the priority of the measurement value-focused course is determined by using the data of Example 2, that is, the input data forms 34 and 35. In the measured value-focused course here, the total score $S_{T\text{-}Measure}$ is obtained by using the equation 1 described above with a weight aa of a reliability level being 0.3, a weight $\alpha_b$ of the number of edges being 0.3, a weight $\alpha_c$ of measurability being 1, a weight $\alpha_d$ of a data amount in a database of material property values being 0.5, and a weight $\alpha_e$ of material property values being 0.3. Since the scores $S_e$ of the material property values are not given in the input data form 35, all the score $S_e$ is set to be 0.

The result of the paths of the measured value-focused course prioritized in order of the total scores is as follows.

[1]: (a) Composition→surface segregated/unsegregated: total score $S_{T\text{-}Measure}$=1.56

[2]: (c) Composition→surface segregated/unsegregated→bulk composition: total score $S_{T\text{-}Measure}$=1.548

[3]: (b) Composition→surface segregated/unsegregated→surface composition: total score $S_{T\text{-}Measure}$=1.482

[4]: (e) Composition→surface segregated/unsegregated→bulk composition→Fermi level depth: total score $S_{T\text{-}Measure}$=1.33

[5]: (k) Composition→surface segregated/unsegregated→bulk composition→Fermi level depth→bonding potential-depth>tensile strength: total score $S_{T\text{-}measure}$=1.293

[6]: (d) Composition→surface segregated/unsegregated→surface composition→surface charge distribution: total score $S_{T\text{-}Measure}$=1.25

[7]: (h) Composition→surface segregated/unsegregated→bulk composition→Fermi level depth→bulk term: total score $S_{T\text{-}measure}$=1.22

[8]: (g) Composition→surface segregated/unsegregated→bulk composition→Fermi level depth→bonding potential depth: total score $S_{T\text{-}measure}$=1.198

[9]: (f) Composition→surface segregated/unsegregated→surface composition→surface charge distribution→surface dipole: total score $S_{T\text{-}measure}$=1.158

[10]: (j) Composition→surface segregated/unsegregated→bulk composition→Fermi level depth→bulk term→work function: total score $S_{T\text{-}Measure}$=1.153

[11]: (i) Composition→surface segregated/unsegregated→surface composition→surface charge distribution→surface dipole→surface term: total score $S_{T\text{-}measure}$=1.093

In the manner described above, the priority in the measured value-focused course is provided.

Example 5

In Example 5, the priority of the data amount-focused course is determined by using the data of Example 2, that is, the input data forms 34 and 35. In the data amount-focused course here, the total score $S_{T\text{-}Data}$ is obtained by using the equation 1 described above with a weight aa of a reliability level being 0.1, a weight ab of the number of edges being 0.1, a weight $\alpha_c$ of measurability being 1, a weight as of a data amount in a database of material property values being 1, and a weight ae of material property values being 0.1. Since the scores $S_e$ of the material property values are not given in the input data form 35, all the score $S_e$ is set to be 0.

The result of the paths of the measured value-focused course prioritized in order of the total scores is as follows.

[1]: (c) Composition→surface segregated/unsegregated→bulk composition: total score $S_{T\text{-}Data}$=1.822

[2]: (a) Composition→surface segregated/unsegregated: total score $S_{T\text{-}Data}$=1.77

[3]: (b) Composition→surface segregated/unsegregated→surface composition: total score $S_{T\text{-}Data}$=1.689

[4]: (e) Composition→surface segregated/unsegregated→bulk composition→Fermi level depth: total score $S_{T\text{-}Data}$=1.51

[5]: (k) Composition→surface segregated/unsegregated→bulk composition→Fermi level depth→bonding potential-depth>tensile strength: total score $S_{T\text{-}Data}=1.437$

[6]: (d) Composition→surface segregated/unsegregated→surface composition→surface charge distribution: total score $S_{T\text{-}Data}=1.4$

[7]: (h) Composition→surface segregated/unsegregated→bulk composition→Fermi level depth→bulk term: total score $S_{T\text{-}Data}=1.33$

[8]: (g) Composition→surface segregated/unsegregated→bulk composition→Fermi level depth→bonding potential depth: total score $S_{T\text{-}Data}=1.323$

[9]: (j) Composition→surface segregated/unsegregated→bulk composition→Fermi level depth→bulk term→work function: total score $S_{T\text{-}Data}=1.293$

[10]: (f) Composition→surface segregated/unsegregated→surface composition→surface charge distribution→surface dipole: total score $S_{T\text{-}Data}=1.243$

[11]: (i) Composition→surface segregated/unsegregated→surface composition→surface charge distribution→surface dipole→surface term: total score $S_{T\text{-}Data}=1.137$ In the manner described above, the priority in the data amount-focused course is provided.

Example 6

In Example 6, the priority of the universal course is determined by using the data of Example 2, that is, the input data forms 34 and 35. In the universal course here, the total score $S_{T\text{-}Univ}$ is obtained by using the equation 1 described above with a weight aa of a reliability level being 0.5, a weight ab of the number of edges being 0.5, a weight $\alpha_q$ of measurability being 0.5, a weight $\alpha_d$ of a data amount in a database of material property values being 0.5, and a weight $\alpha_e$ of material property values being 0.5. Since the scores $S_e$ of the material property values are not given in the input data form 35, all the score $S_e$ is set to be 0.

The result of the paths of the measured value-focused course prioritized in order of the total scores is as follows.

[1]: (a) Composition→surface segregated/unsegregated: total score $S_{T\text{-}Univ}=1.2$

[2]: (c) Composition→surface segregated/unsegregated→bulk composition: total score $S_{T\text{-}Univ}=1.158$

[3]: (b) Composition→surface segregated/unsegregated→surface composition: total score $S_{T\text{-}Univ}=1.092$

[4]: (k) Composition→surface segregated/unsegregated→bulk composition→Fermi level depth→bonding potential-depth>tensile strength: total score $S_{T\text{-}Univ}=1.033$

[5]: (e) Composition→surface segregated/unsegregated→bulk composition→Fermi level depth: total score $S_{T\text{-}Univ}=1.025$

[6]: (h) Composition→surface segregated/unsegregated→bulk composition→Fermi level depth→bulk term: total score $S_{T\text{-}Univ}=0.98$

[7]: (g) Composition→surface segregated/unsegregated→bulk composition→Fermi level depth→bonding potential depth: total score $S_{T\text{-}Univ}=0.943$

[8]: (d) Composition→surface segregated/unsegregated→surface composition→surface charge distribution: total score $S_{T\text{-}Univ}=0.925$

[9]: (f) Composition→surface segregated/unsegregated→surface composition→surface charge distribution→surface dipole: total score $S_{T\text{-}Univ}=0.903$

[10]: (i) Composition→surface segregated/unsegregated→surface composition→surface charge distribution→surface dipole→surface term: total score $S_{T\text{-}Univ}=0.883$

[11]: (j) Composition→surface segregated/unsegregated→bulk composition→Fermi level depth→bulk term→work function: total score $S_{T\text{-}Univ}=0.839$ In the manner described above, the priority in the universal course is provided.

Example 7

Figure 18:
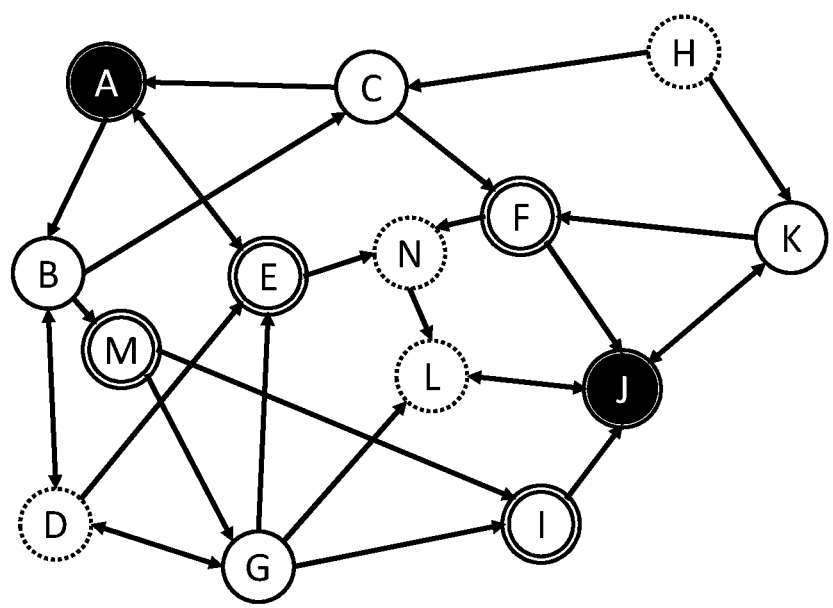
FIG. 18 is a diagram illustrating a graph in Example 7.

In Example 7, an example of a method for prioritizing paths A to J in the graph illustrated in FIG. 18 when measurability of material properties is the item with which priority is determined will be described. Here, when the material property value is measurable in principle and measurement method therefor exists, the score is weighed to be 1, when the material property value is measurable in principle but measurement method therefor is not known, the score is weighed to be 0.4, and when the material property value is not measurable in principle, the score is weighed to be 0. In FIGS. 18, A, E, F, I, M, and J, in which the material property value is measurable in principle and measurement method therefor exists, are illustrated by double circles, B, C, G, and K, in which the material property value is measurable in principle but measurement method therefor is not known, are illustrated by single circles, and D, H, L, and N, in which the material property value is not measurable in principle, are illustrated by broken-line circles.

There are 12 paths from A to J. For each path, the nodes are calculated as follows by using the above-described number of edges.

A→B→C→F→J: 0.4+0.4+1=1.8
A→B→C→F→N→L→J: 0.4+0.4+1+0+0=1.8
A→B→M→G→E→N→L→J: 0.4+1+0.4+1+0+0=2.8
A→B→M→G→I→J: 0.4+1+0.4+1=2.8
A→B→M→G→L→J: 0.4+1+0.4+0=1.8
A→B→M→G→D→E→N→L→J: 0.4+1+0.4+0+1+9+0=2.8
A→B→M→I→J: 0.4+1+1=2.4
A→B→D→G→E→N→L→J: 0.4+0+0.4+1+0+0=1.8
A→B→D→G→I→J: 0.4+0+0.4+1=1.8
A→B→D→G→L→J: 0.4+0+0.4+0=0.8
A→B→D→E→N→L→J: 0.4+0+1+0+0=1.4
A→E→N→L→J: 1+0+0=1

Values obtained by dividing these values by the number of nodes constituting the paths (the number of nodes excluding the starting point) are as follows. Here, the values are rounded to the third decimal place for the ease of viewing.

A→B→C→F→J: 1.8/4=0.45
A→B→C→F→N→L→J: 1.8/6=0.3
A→B→M→G→E→N→L→J: 2.8/7=0.4
A→B→M→G→I→J: 2.8/5=0.56
A→B→M→G→L→J: 1.8/5=0.36
A→B→M→G→D→E→N→L→J: 2.8/8=0.35
A→B→M→I→J: 2.4/4=0.6
A→B→D→G→E→N→L→J: 1.8/7=0.257
A→B→D→G→I→J: 1.8/5=0.36
A→B→D→G→L→J: 0.8/5=0.16
A→B→D→E→N→L→J: 1.4/6=0.233
A→E→N→L→J: 1/4=0.25

When the scores are the same, a path with a smaller number of nodes is prioritized. The paths are prioritized in the descending order of scores as follows.

[1] A→B→M→I→J: Score=0.6
[2] A→B→M→G→I→J: Score=0.56
[3] A→B→C→F→J: Score=0.45
[4] A→B→M→G→E→N→L→J: Score=0.4
[5] A→B→M→G→L→J: Score=0.36

[5] A→B→D→G→I→J: Score=0.36
[7] A→B→M→G→D→E→N→L→J: Score=0.35
[8] A→B→C→F→N→L→J: Score=0.3
[9] A→B→D→G→E→N→L→J: Score=0.257
[10] A→E→N→L→J: Score=0.25
[11] A→B→D→E→N→L→J: Score=0.233
[12] A→B→D→G→L→J: Score=0.16

In this manner, the priority when measurability of material property values is the item with which priority is determined is provided.

Example 8

Figure 19:
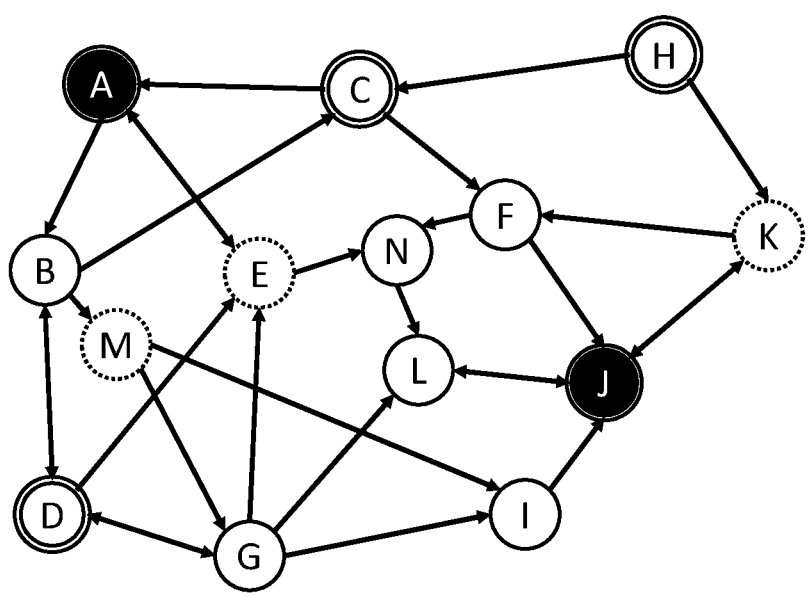
FIG. 19 is a diagram illustrating a graph in Example 8.

In Example 8, an example of a method for prioritizing paths A to J in the graph illustrated in FIG. 19 when a data amount in a database of material properties is the item with which priority is determined will be described. Here, the scores are weighed by 0.9 when the data amount after an S-shaped curve of a sigmoid function is large, 0.1 when the data amount is small, and 0.5 when the data amount is between large and small. In FIGS. 19, A, C, D, H, and J, in which the data amount is large, are illustrated by double circles, B, F, I, L and N, in which the data amount is middle, are illustrated by single circles, and E, K, and M, in which the data amount is small, are illustrated by broken-line circles.

There are 12 paths from A to J. For each path, the nodes are calculated as follows by
using the above-described number of edges.
A→B→C→F→J: 0.5+0.9+0.5=1.9
A→B→C→F→N→L→J: 0.5+0.9+0.5+0.5+0.5=2.9
A→B→M→G→E→N→L→J: 0.5+0.1+0.5+0.1+0.5+0.5=2.2
A→B→M→G→I→J: 0.5+0.1+0.5+0.5=1.6
A→B→M→G→L→J: 0.5+0.1+0.5+0.5=1.6
A→B→M→G→D→E→N→L→J: 0.5+0.1+0.5+0.9+0.1+0.5+0.5=3.1
A→B→M→I→J: 0.5+0.1+0.5=1.1
A→B→D→G→E→N→L→J: 0.5+0.9+0.5+0.1+0.5+0.5=3
A→B→D→G→I→J: 0.5+0.9+0.5+0.5=2.4
A→B→D→G→L→J: 0.5+0.9+0.5+0.5=2.4
A→B→D→E→N→L→J: 0.5+0.9+0.1+0.5+0.5=2.5
A→E→N→L→J: 0.1+0.5+0.5=1.1

Values obtained by dividing these values by the number of nodes constituting the paths (the number of nodes excluding the starting point) are as follows. Here, the values are rounded to the third decimal place for the ease of viewing.
A→B→C→F→J: 1.9/4=0.475
A→B→C→F→N→L→J: 2.9/6=0.483
A→B→M→G→E→N→L→J: 2.2/7=0.314
A→B→M→G→I→J: 1.6/5=0.32
A→B→M→G→L→J: 1.6/5=0.32
A→B→M→G→D→E→N→L→J: 3.1/8=0.388
A→B→M→I→J: 1.1/4=0.275
A→B→D→G→E→N→L→J: 3/7=0.429
A→B→D→G→I→J: 2.4/5=0.48
A→B→D→G→L→J: 2.4/5=0.48
A→B→D→E→N→L→J: 2.5/6=0.417
A→E→N→L→J: 1.1/4=0.275

When the scores are the same, a path with a smaller number of nodes is prioritized. The paths are prioritized in the descending order of scores as follows.
[1] A→B→C→F→N→L→J: 2.9/6=0.483
[2] A→B→D→G→I→J: 2.4/5=0.48
[2] A→B→D→G→L→J: 2.4/5=0.48
[4] A→B→C→F→J: 1.9/4=0.475
[5] A→B→D→G→E→N→L→J: 3/7=0.429
[6] A→B→D→E→N→L→J: 2.5/6=0.417
[7] A→B→M→G→D→E→N→L→J: 3.1/8=0.388
[8] A→B→M→G→I→J: 1.6/5=0.32
[8] A→B→M→G→L→J: 1.6/5=0.32
[10] A→B→M→G→E→N→L→J: 2.2/7=0.314
[11] A→B→M→I→J: 1.1/4=0.275
[11] A→E→N→L→J: 1.1/4=0.275

In this manner, the priority when a data amount in a database of material property values is the item with which priority is determined is provided.

Example 9

Figure 20:
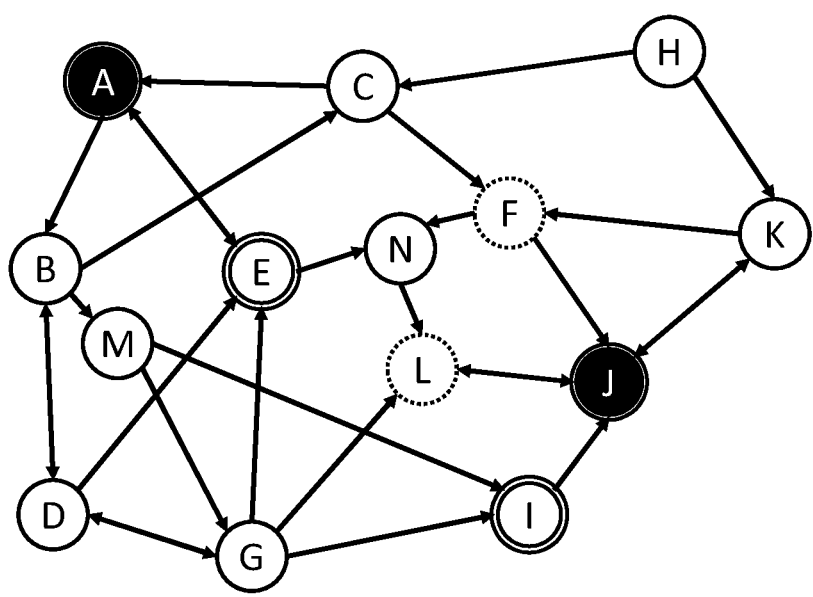
FIG. 20 is a diagram illustrating a graph in Example 9.

In Example 9, an example of a method for prioritizing paths A to J in the graph illustrated in FIG. 20 when a material property value is the item with which priority is determined will be described. Here, when a numerical range designated by the user is less than o with respect to the standard deviation o of the material property value stored in the database, a weighed of 1 is given, when the numerical range is equal to or greater than σ and less than 3σ, a weight of 0.7 is given, and when the numerical range is equal to or greater than 3σ, a weight of 0.3 is given. In FIGS. 20, A, E, I, and J, in which less than o, are illustrated by double circles, B, C, D, G, H, K, and M, in which equal to or greater than σ and less than 3σ, are illustrated by single circles, and F and L, in which equal to or greater than 3σ, are illustrated by broken-line circles.

There are 12 paths from A to J. For each path, the nodes are calculated as follows by using the above-described number of edges.
A→B→C→F→J: 0.7+0.7+0.3=1.7
A→B→C→F→N→L→J: 0.7+0.7+0.3+0.7+0.3=2.7
A→B→M→G→E→N→L→J: 0.7+0.7+0.7+1+0.7+0.3=4.1
A→B→M→G→I→J: 0.7+0.7+0.7+1=3.1
A→B→M→G→L→J: 0.7+0.7+0.7+0.3=2.4
A→B→M→G→D→E→N→L→J: 0.7+0.7+0.7+0.7+1+0.7+0.3=4.8
A→B→M→I→J: 0.7+0.7+1=2.4
A→B→D→G→E→N→L→J: 0.7+0.7+0.7+1+0.7+0.3=4.1
A→B→D→G→I→J: 0.7+0.7+0.7+1=3.1
A→B→D→G→L→J: 0.7+0.7+0.7+0.3=2.4
A→B→D→E→N→L→J: 0.7+0.7+1+0.7+0.3=3.4
A→E→N→L→J: 1+0.7+0.3=2

Values obtained by dividing these values by the number of nodes constituting the paths (the number of nodes excluding the starting point) are as follows. Here, the values are rounded to the third decimal place for the ease of viewing.
A→B→C→F→J: 1.7/4=0.425
A→B→C→F→N→L→J: 2.7/6=0.45
A→B→M→G→E→N→L→J: 4.1/7=0.586
A→B→M→G→I→J: 3.1/5=0.62
A→B→M→G→L→J: 2.4/5=0.48
A→B→M→G→D→E→N→L→J: 4.8/8=0.6
A→B→M→I→J: 2.4/4=0.6
A→B→D→G→E→N→L→J: 4.1/7=0.586
A→B→D→G→I→J: 3.1/5=0.62
A→B→D→G→L→J: 2.4/5=0.48
A→B→D→E→N→L→J: 3.4/6=0.567
A→E→N→L→J: 2/4=0.5

When the scores are the same, a path with a smaller number of nodes is prioritized. The paths are prioritized in the descending order of scores as follows.

[1] A→B→M→G→I→J: 3.1/5=0.62
[1] A→B→D→G→I→J: 3.1/5=0.62
[3] A→B→M→I→J: 2.4/4=0.6
[4] A→B→M→G→D→E→N→L→J: 4.8/8=0.6
[5] A→B→M→G→E→N→L→J: 4.1/7=0.586
[5] A→B→D→G→E→N→L→J: 4.1/7=0.586
[7] A→B→D→E→N→L→J: 3.4/6=0.567
[8] A→E→N→L→J: 2/4=0.5
[9] A→B→M→G→L→J: 2.4/5=0.48
[9] A→B→D→G→L→J: 2.4/5=0.48
[11] A→B→C→F→N→L→J: 2.7/6=0.45
[12] A→B→C→F→J: 1.7/4=0.425

In this manner, the priority when the material property value is the item with which priority is determined is provided.

INDUSTRIAL APPLICABILITY

When a huge amount of accumulated data about materials and material properties, i.e., big data, is used to present a relationship between unknown material properties in order of priority, such as a relationship level, it is considered that a breakthrough is made in the material technology and the technology makes a great progress. By using the big data, the present invention presents, in order of priority, a combination of material property parameters having a significant relationship from among arbitrary combinations of material property parameters. Therefore, the present invention is expected to greatly contribute to the development of the material technology by efficiently presenting the relationship between unknown material properties.

EXPLANATION OF SIGN

1 Database
2 Graph generation means
3 Graph search means
4 prioritization means
5 User interface means
6 Data access means
16 Database
21 Database (Material property parameters relationship database)
22 Graph generation Means
23 Graph
31, 32, 33, 33, 34, 35 Input data forms
101 Search system
102 Search device

The invention claimed is:

1. A search method for searching for a relationship between material properties stored in a database held in a storage device, the search method comprising a graph generation step, a graph search step, and a prioritization step, wherein the database stores multiple pairs of material property parameters having mutual relationships;

the graph generation step includes generating a graph in which the multiple material property parameters stored in the database are represented as nodes, and inter-node spaces corresponding to the respective material property parameter pairs each being stored as having a relationship therebetween are represented as edges;

the graph search step includes searching the graph on the basis of a given search condition and presenting multiple related material properties or inter-material property relationship paths representing relationships between material properties; and the prioritization step includes obtaining, by using information about one or both of the nodes and the edges, priority for the presented multiple related material properties or inter-material property relationship paths, and outputting a result in the descending order of priority, the search method further comprising a condition extraction step and a path evaluation step, wherein regarding a pair of material property parameters for which a condition for prescribing presence/absence of a relationship exists among the multiple pairs of material property parameters having mutual relationships, the database is further configured to store that condition;

in the condition extraction step, the condition is extracted from the database in association with, as a conditional edge, an edge corresponding to a pair for which presence/absence of a relationship is prescribed by that condition;

in the graph search step, one or multiple paths are extracted from the graph and output as a search result;

in the path evaluation step, whether the one or multiple paths include the conditional edge is determined, and paths which include the conditional edge are excluded from the one or multiple paths when a condition corresponding to the conditional edge is not satisfied, to obtain a search result for the prioritization step; and a result including the search result for the prioritization step is output in the descending order of priority in the prioritization step.

2. The search method according to claim 1, wherein the graph is a directed graph; and in the graph generation step, when a relationship between the pair of material property parameters is bidirectional, a bidirectional edge corresponding to the pair of material property parameters is generated, and when, if a value of a first material property parameter of the pair of material property parameters is determined, a value of a second material property parameter is determined but not vice versa, a one-way edge from a node corresponding to the first material property parameter to a node corresponding to the second material property parameter is generated as the corresponding edge.

3. A search device, wherein the search method according to claim 2 is used.

4. A search method for searching for a relationship between material properties stored in a database held in a storage device, the search method comprising a graph generation step, a graph search step, and a prioritization step, wherein the database stores multiple pairs of material property parameters having mutual relationships;

the graph generation step includes generating a graph in which the multiple material property parameters stored in the database are represented as nodes, and inter-node spaces corresponding to the respective material property parameter pairs each being stored as having a relationship therebetween are represented as edges;

the graph search step includes searching the graph on the basis of a given search condition and presenting multiple related material properties or inter-material property relationship paths representing relationships between material properties; and the prioritization step includes obtaining, by using information about one or both of the nodes and the edges, priority for the presented multiple related material properties or inter-material property relationship paths, and outputting a result in the descending order of priority, wherein the database is further configured to store reliability information of a relationship indicating that, for the multiple pairs of material property parameters having mutual relationships, the relationship is a strictly theoretically established relationship, a relationship that has been empirically correlated and is not theoretically established, a semi-quantitative relationship, or a qualitative relationship;

in the graph search step, the graph is searched by also using the reliability information to obtain a search result for the prioritization step; and a result including the search result for the prioritization step is output in the descending order of priority in the prioritization step.

5. A search method for searching for a relationship between material properties stored in a database held in a storage device, the search method comprising a graph generation step, a graph search step, and a prioritization step, wherein the database stores multiple pairs of material property parameters having mutual relationships;

the graph generation step includes generating a graph in which the multiple material property parameters stored in the database are represented as nodes, and inter-node spaces corresponding to the respective material property parameter pairs each being stored as having a relationship therebetween are represented as edges;

the graph search step includes searching the graph on the basis of a given search condition and presenting multiple related material properties or inter-material property relationship paths representing relationships between material properties; and the prioritization step includes obtaining, by using information about one or both of the nodes and the edges, priority for the presented multiple related material properties or inter-material property relationship paths, and outputting a result in the descending order of priority, wherein in the prioritization step, priority is obtained by using at least one of a reliability level based on the reliability information, the number of edges entering and exiting the material property, measurability of the material property value, a data amount in a database of the material property value, the material property value, and the number of nodes constituting a path.

6. The search method according to claim 5, wherein an added score is obtained for any item of the number of edges entering and exiting the material property, measurability of the material property value, the data amount in the database of the material property value, and the material property value, and a result is output in the descending order of the added score as priority.

7. The search method according to claim 5, wherein an item-added score in which a score for each item is weighed and added is obtained for at least one of the multiple items of the reliability level, the number of edges entering and exiting the material property, the measurability of the material property value, the data amount in the database of the material property value, and the material property value, and a result is output in the descending order of the item-added score as priority;

the priorities are, by the weight for the items:

a reliability level-focused priority in which the weight of the reliability level is larger than weights of other of the items, a control-focused priority in which the weight of the number of edges entering and exiting the material property is larger than weights of other of the items, a measured value-focused priority in which the weight of the measurability of the material property value is larger than weights of other of the items, a data amount-focused priority in which the weight of the data amount in the database of the material property value, from among measurable material property values, is larger than weights of other of the items, a material property-limited priority in which the weight of the material property value, from among measurable material property values, is larger than weights of other of the items, and a universal priority in which all the weights of the items are the same.

8. A search method for searching for a relationship between material properties stored in a database held in a storage device, the search method comprising a graph generation step, a graph search step, and a prioritization step, wherein the database stores multiple pairs of material property parameters having mutual relationships;

the graph generation step includes generating a graph in which the multiple material property parameters stored in the database are represented as nodes, and inter-node spaces corresponding to the respective material property parameter pairs each being stored as having a relationship therebetween are represented as edges;

the graph search step includes searching the graph on the basis of a given search condition and presenting multiple related material properties or inter-material property relationship paths representing relationships between material properties; and the prioritization step includes obtaining, by using information about one or both of the nodes and the edges, priority for the presented multiple related material properties or inter-material property relationship paths, and outputting a result in the descending order of priority, wherein the prioritization step includes:

a scoring step for scoring at least one of the reliability level, the number of edges entering and exiting the material property, the measurability of the material property value, the data amount in the database of the material property value, and the material property value;

a score addition step for weighing at least one of the scores of the reliability level, the number of edges entering and exiting the material property, measurability of the material property value, the data amount in the database of the material property value, and the material property value, the scores being obtained in the scoring step, and adding the scores for each of the inter-material property relationship paths; and an inter-material property relationship paths prioritization step for arranging the inter-material property relationship paths in the order of the added score obtained by the score addition step.

9. A search system, comprising:

a database, a graph generation means, a graph search means, and a prioritization means, wherein the database stores multiple pairs of material property parameters having mutual relationships;

the graph generation means generates a graph in which the multiple material property parameters stored in the database are represented as nodes, and inter-node spaces corresponding to the respective material property parameter pairs each being stored as having a relationship therebetween are represented as edges;

the graph search means searches the graph on the basis of a given search condition to obtain a graph search result; and the prioritization means obtains, by using information about one or both of the nodes and the edges, priority for the presented multiple related material properties or inter-material property relationship paths, and outputs a result in the descending order of priority;

the search system further comprising a condition extraction means and a path evaluation means, wherein regarding a pair of material property parameters for which a condition for prescribing presence/absence of a relationship exists among the multiple pairs of material property parameters having mutual relationships, the database is further configured to store that condition;

the condition extraction means extracts the condition from the database in association with, as a conditional edge, an edge corresponding to a pair for which presence/absence of a relationship is prescribed by that condition;

the graph search means extracts one or multiple paths from the graph and outputs as a search result;

the path evaluation means determines whether the one or multiple paths include the conditional edge and excludes paths which include the conditional edge from the one or multiple paths when a condition corresponding to the conditional edge is not satisfied, to obtain a search result for the prioritization means; and the prioritization means outputs a result including the search result for the prioritization means in the descending order of priority.

10. The search system according to claim 9, wherein the graph is a directed graph; and in the graph generation means, when a relationship between the pair of material property parameters is bidirectional, a bidirectional edge corresponding to the pair of material property parameters is generated, and when, if a value of a first material property parameter of the pair of material property parameters is determined, a value of a second material property parameter is determined but not vice versa, a one-way edge from a node corresponding to the first material property parameter to a node corresponding to the second material property parameter is generated as the corresponding edge.

11. A search system, comprising:

a database, a graph generation means, a graph search means, and a prioritization means, wherein the database stores multiple pairs of material property parameters having mutual relationships;

the graph generation means generates a graph in which the multiple material property parameters stored in the database are represented as nodes, and inter-node spaces corresponding to the respective material property parameter pairs each being stored as having a relationship therebetween are represented as edges;

the graph search means searches the graph on the basis of a given search condition to obtain a graph search result; and the prioritization means obtains, by using information about one or both of the nodes and the edges, priority for the presented multiple related material properties or inter-material property relationship paths, and outputs a result in the descending order of priority, wherein the database is further configured to store reliability information of a relationship indicating that, for the multiple pairs of material property parameters having mutual relationships, the relationship is a strictly theoretically established relationship, a relationship that has been empirically correlated and is not theoretically established, a semi-quantitative relationship, or a qualitative relationship;

the graph search means searches the graph by also using the reliability information to obtain a search result for the prioritization means; and the prioritization means outputs a result including the search result for the prioritization means in the descending order of priority.

12. A search system, comprising:

a database, a graph generation means, a graph search means, and a prioritization means, wherein the database stores multiple pairs of material property parameters having mutual relationships;

the graph generation means generates a graph in which the multiple material property parameters stored in the database are represented as nodes, and inter-node spaces corresponding to the respective material property parameter pairs each being stored as having a relationship therebetween are represented as edges;

the graph search means searches the graph on the basis of a given search condition to obtain a graph search result; and the prioritization means obtains, by using information about one or both of the nodes and the edges, priority for the presented multiple related material properties or inter-material property relationship paths, and outputs a result in the descending order of priority, wherein the prioritization means obtains priority by using at least one of the reliability level, the number of edges entering and exiting the material property, measurability of the material property value, the amount of data in the database of the material property value, the material property value, and the number of nodes constituting the paths.

13. The search system according to claim 12, wherein an added score is obtained for any item of the number of edges entering and exiting the material property, measurability of the material property value, the data amount in the database of the material property value, and the material property value, and a result is output in the descending order of the added score as priority.

14. The search system according to claim 12, wherein an item-added score in which a score for each item is weighed and added is obtained for at least one of the multiple items of the reliability level, the number of edges entering and exiting the material property, the measurability of the material property value, the data amount in the database of the material property value, and the material property value, and a result is output in the descending order of the item-added score as priority; and the priorities are, by the weight for the items:

a reliability level-focused priority in which the weight of the reliability level is larger than weights of other of the items, a control-focused priority in which the weight of the number of edges entering and exiting the material property is larger than weights of other of the items, a measured value-focused priority in which the weight of the measurability of the material property value is larger than weights of other of the items, a data amount-focused priority in which the weight of the data amount in the database of the material property value, from among measurable material property values, is larger than weights of other of the items, a material property-limited priority in which the weight of the material property value, from among measurable material property values, is larger than weights of other of the items, and a universal priority in which all the weights of the items are the same.

15. A search system, comprising:

a database, a graph generation means, a graph search means, and a prioritization means, wherein the database stores multiple pairs of material property parameters having mutual relationships;

the graph generation means generates a graph in which the multiple material property parameters stored in the database are represented as nodes, and inter-node spaces corresponding to the respective material property parameter pairs each being stored as having a relationship therebetween are represented as edges;

the graph search means searches the graph on the basis of a given search condition to obtain a graph search result; and the prioritization means obtains, by using information about one or both of the nodes and the edges, priority for the presented multiple related material properties or inter-material property relationship paths, and outputs a result in the descending order of priority, wherein the prioritization means includes:

a scoring means that scores at least one of the reliability level, the number of edges entering and exiting the material property, the measurability of the material property value, the data amount in the database of the material property value, and the material property value;

a score addition means that weighs at least one of the scores of the reliability level, the number of edges entering and exiting the material property, measurability of the material property value, the data amount in the database of the material property value, and the material property value, the scores being obtained in the scoring step, and adds the scores for each of the inter-material property relationship paths; and an inter-material property relationship paths prioritization means that arranges the inter-material property relationship paths in the order of the added score obtained by the score addition means.

* * * * *